(12) United States Patent
Sugiura et al.

(10) Patent No.: US 12,068,154 B2
(45) Date of Patent: Aug. 20, 2024

(54) METHOD OF FORMING A NITROGEN-CONTAINING CARBON FILM AND SYSTEM FOR PERFORMING THE METHOD

(71) Applicant: ASM IP Holding B.V., Almere (NL)

(72) Inventors: Hirotsugu Sugiura, Tama (JP); Yoshiyuki Kikuchi, Tokyo (JP)

(73) Assignee: ASM IP Holding B.V., Almere (NL)

( * ) Notice: Subject to any disclaimer, the term of this patent is extended or adjusted under 35 U.S.C. 154(b) by 327 days.

(21) Appl. No.: 17/225,386

(22) Filed: Apr. 8, 2021

(65) Prior Publication Data

US 2021/0320003 A1  Oct. 14, 2021

Related U.S. Application Data

(60) Provisional application No. 63/009,318, filed on Apr. 13, 2020.

(51) Int. Cl.
| | |
|---|---|
| C23C 16/34 | (2006.01) |
| C23C 16/455 | (2006.01) |
| C23C 16/50 | (2006.01) |
| H01J 37/32 | (2006.01) |
| H01L 21/02 | (2006.01) |

(52) U.S. Cl.
CPC ...... *H01L 21/02118* (2013.01); *C23C 16/347* (2013.01); *C23C 16/45553* (2013.01); *C23C 16/50* (2013.01); *H01J 37/3244* (2013.01); *H01L 21/02205* (2013.01); *H01L 21/02274* (2013.01); *H01L 21/0228* (2013.01); *H01J 2237/332* (2013.01)

(58) Field of Classification Search
CPC ......... H01L 21/02118; H01L 21/02205; H01L 21/02274; H01L 21/0228; C23C 16/347; C23C 16/45553; C23C 16/50; C23C 16/00; C23C 16/455; C23C 16/45525; C23C 16/22; H01J 37/3244; H01J 2237/332

See application file for complete search history.

(56) References Cited

U.S. PATENT DOCUMENTS

| | | | |
|---|---|---|---|
| 3,197,682 A | 7/1965 | Klass et al. | |
| 3,634,740 A | 1/1972 | Stevko | |
| 3,916,270 A | 10/1975 | Wachtler et al. | |

(Continued)

FOREIGN PATENT DOCUMENTS

| | | |
|---|---|---|
| CN | 101047143 | 10/2007 |
| CN | 101308794 | 9/2010 |

(Continued)

OTHER PUBLICATIONS

Gordon, "Chemist's Companion—A Handbook of Practical Data, Techniques, and References" 1972, p. 1-2 (Year: 1972).*

(Continued)

*Primary Examiner* — Katherine A Bareford
*Assistant Examiner* — Christina D McClure
(74) *Attorney, Agent, or Firm* — Snell & Wilmer L.L.P.

(57) ABSTRACT

Methods and systems for forming a forming a nitrogen-containing carbon film and structures formed using the methods or systems are disclosed. Exemplary methods include providing a precursor with carbon-terminated carbon-nitrogen bonds. The methods can further include providing a reactant to the reaction chamber.

13 Claims, 3 Drawing Sheets

(56) References Cited

U.S. PATENT DOCUMENTS

| | | | |
|---|---|---|---|
| 3,983,401 A | 9/1976 | Livesay |
| 4,099,041 A | 7/1978 | Berkman et al. |
| 4,184,188 A | 1/1980 | Briglia |
| 4,241,000 A | 12/1980 | McCauley et al. |
| 4,384,918 A | 5/1983 | Abe |
| 4,412,133 A | 10/1983 | Eckes et al. |
| 4,480,284 A | 10/1984 | Tojo et al. |
| 4,481,300 A | 11/1984 | Hartnett et al. |
| 4,496,828 A | 1/1985 | Kusmierz et al. |
| 4,502,094 A | 2/1985 | Lewin et al. |
| 4,520,116 A | 5/1985 | Gentilman et al. |
| 4,520,421 A | 5/1985 | Sakitani et al. |
| 4,535,628 A | 8/1985 | Hope |
| 4,551,192 A | 11/1985 | Di Milia et al. |
| 4,554,611 A | 11/1985 | Lewin |
| 4,700,089 A | 10/1987 | Fujii et al. |
| 4,720,362 A | 1/1988 | Gentilman et al. |
| 4,804,086 A | 2/1989 | Grohrock |
| 4,880,982 A | 11/1989 | Hoksaas |
| 4,886,162 A | 12/1989 | Ambrogio |
| 4,931,135 A | 6/1990 | Horiuchi et al. |
| 4,949,671 A | 8/1990 | Davis et al. |
| 4,963,506 A | 10/1990 | Liaw et al. |
| 5,117,121 A | 5/1992 | Watanabe et al. |
| 5,124,272 A | 6/1992 | Saito et al. |
| 5,125,710 A | 6/1992 | Gianelo |
| 5,186,120 A | 2/1993 | Ohnishi et al. |
| 5,208,961 A | 5/1993 | Lajoie |
| 5,219,226 A | 6/1993 | James |
| 5,231,062 A | 7/1993 | Mathers et al. |
| 5,242,501 A | 9/1993 | McDiarmid |
| 5,250,092 A | 10/1993 | Nakano |
| 5,252,133 A | 10/1993 | Miyazaki et al. |
| 5,252,134 A | 10/1993 | Stauffer |
| 5,280,894 A | 1/1994 | Witcraft et al. |
| 5,295,777 A | 3/1994 | Hodos |
| 5,298,089 A | 3/1994 | Bowe et al. |
| 5,308,788 A | 5/1994 | Fitch et al. |
| 5,310,410 A | 5/1994 | Begin et al. |
| 5,328,360 A | 7/1994 | Yokokawa |
| 5,362,328 A | 11/1994 | Gardiner et al. |
| 5,378,501 A | 1/1995 | Foster et al. |
| 5,456,757 A | 10/1995 | Aruga et al. |
| 5,478,429 A | 12/1995 | Komino et al. |
| 5,518,780 A | 5/1996 | Tamor et al. |
| 5,540,821 A | 7/1996 | Tepman |
| 5,565,038 A | 10/1996 | Ashley |
| 5,584,936 A | 12/1996 | Pickering et al. |
| 5,584,963 A | 12/1996 | Takahashi |
| 5,637,153 A | 6/1997 | Niino et al. |
| 5,645,646 A | 7/1997 | Beinglass et al. |
| 5,661,263 A | 8/1997 | Salvaggio |
| 5,683,561 A | 11/1997 | Hollars et al. |
| 5,690,742 A | 11/1997 | Ogata et al. |
| 5,732,957 A | 3/1998 | Yu |
| 5,804,505 A | 9/1998 | Yamada et al. |
| 5,851,293 A | 12/1998 | Lane et al. |
| 5,855,687 A | 1/1999 | DuBois et al. |
| 5,871,586 A | 2/1999 | Crawley et al. |
| 5,888,304 A | 3/1999 | Umotoy et al. |
| 5,897,710 A | 4/1999 | Sato et al. |
| 5,976,973 A | 11/1999 | Ohira et al. |
| 6,022,180 A | 2/2000 | Motoyama et al. |
| 6,022,802 A | 2/2000 | Jang |
| 6,025,117 A | 2/2000 | Nakano et al. |
| 6,033,215 A | 3/2000 | Ohsawa |
| 6,090,442 A | 7/2000 | Klaus et al. |
| 6,093,611 A | 7/2000 | Gardner et al. |
| 6,099,651 A | 8/2000 | Sajoto et al. |
| 6,139,983 A | 10/2000 | Ohashi et al. |
| 6,143,129 A | 11/2000 | Savas et al. |
| 6,152,669 A | 11/2000 | Morita et al. |
| 6,159,301 A | 12/2000 | Sato et al. |
| 6,176,929 B1 | 1/2001 | Fukunaga et al. |
| 6,177,688 B1 | 1/2001 | Linthicum et al. |
| 6,189,482 B1 | 2/2001 | Zhao et al. |
| 6,217,662 B1 | 4/2001 | Kong et al. |
| 6,224,679 B1 | 5/2001 | Sasaki et al. |
| 6,235,121 B1 | 5/2001 | Honma et al. |
| 6,239,402 B1 | 5/2001 | Araki et al. |
| 6,239,715 B1 | 5/2001 | Belton |
| 6,245,647 B1 | 6/2001 | Akiyama et al. |
| 6,271,320 B1 | 8/2001 | Keller et al. |
| 6,328,864 B1 | 12/2001 | Ishizawa et al. |
| 6,335,293 B1 | 1/2002 | Luo et al. |
| 6,387,823 B1 | 5/2002 | Sonderman et al. |
| 6,452,017 B1 | 9/2002 | Uhlenbrock et al. |
| 6,462,310 B1 | 10/2002 | Ratliff et al. |
| 6,464,825 B1 | 10/2002 | Shinozaki |
| 6,474,987 B1 | 11/2002 | Huang et al. |
| 6,475,902 B1 | 11/2002 | Hausmann et al. |
| 6,596,398 B1 | 7/2003 | Russo et al. |
| 6,623,799 B1 | 9/2003 | Lee et al. |
| 6,658,933 B2 | 12/2003 | Allegre et al. |
| 6,659,111 B1 | 12/2003 | Mouri et al. |
| 6,676,759 B1 | 1/2004 | Takagi |
| 6,692,903 B2 | 2/2004 | Chen et al. |
| 6,712,949 B2 | 3/2004 | Gopal |
| 6,716,477 B1 | 4/2004 | Komiyama et al. |
| 6,720,262 B2 | 4/2004 | Koh et al. |
| 6,766,545 B2 | 7/2004 | Hodges |
| 6,776,849 B2 | 8/2004 | Aggarwal et al. |
| 6,818,566 B2 | 11/2004 | Leeson et al. |
| 6,821,889 B2 | 11/2004 | Elers et al. |
| 6,825,106 B1 | 11/2004 | Gao et al. |
| 6,843,858 B2 | 1/2005 | Rossman |
| 6,854,580 B2 | 2/2005 | Braford |
| 6,867,086 B1 | 3/2005 | Chen et al. |
| 6,867,153 B2 | 3/2005 | Tokunaga |
| 6,902,647 B2 | 6/2005 | Hasper |
| RE38,937 E | 1/2006 | Nakamura |
| D524,600 S | 7/2006 | Austin et al. |
| D525,127 S | 7/2006 | Cogley et al. |
| 7,122,844 B2 | 10/2006 | Nakamura et al. |
| 7,144,806 B1 | 12/2006 | Fair et al. |
| D535,673 S | 1/2007 | Conway et al. |
| 7,229,502 B2 | 6/2007 | Wang et al. |
| D549,815 S | 8/2007 | Murphy |
| 7,297,641 B2 | 11/2007 | Todd et al. |
| 7,311,977 B2 | 12/2007 | Yokota et al. |
| D562,357 S | 2/2008 | Hardy |
| 7,410,915 B2 | 8/2008 | Morisada et al. |
| 7,504,344 B2 | 3/2009 | Matsuki et al. |
| 7,632,549 B2 | 12/2009 | Goundar |
| 7,638,441 B2 | 12/2009 | Morisada et al. |
| 7,662,689 B2 | 2/2010 | Boyanov et al. |
| D614,258 S | 4/2010 | Kojima |
| 7,727,880 B1 | 6/2010 | Chattopadhyay et al. |
| 7,858,898 B2 | 12/2010 | Bailey et al. |
| D633,452 S | 3/2011 | Namiki et al. |
| 8,128,333 B2 | 3/2012 | Aburatani |
| 8,173,554 B2 | 5/2012 | Lee et al. |
| 8,253,204 B2 | 8/2012 | Lee et al. |
| 8,278,224 B1 | 10/2012 | Mui et al. |
| 8,318,584 B2 | 11/2012 | Li et al. |
| 8,404,044 B2 | 3/2013 | Arai |
| 8,435,894 B2 | 5/2013 | Chandrashekar et al. |
| 8,443,484 B2 | 5/2013 | Ozaki et al. |
| 8,507,720 B2 | 8/2013 | Shay |
| D693,782 S | 11/2013 | Mori et al. |
| 8,637,384 B2 | 1/2014 | Ando et al. |
| 8,784,676 B2 | 7/2014 | Guha et al. |
| 8,895,395 B1 | 11/2014 | Kerber et al. |
| 8,937,800 B2 | 1/2015 | Lubomirsky et al. |
| 8,968,989 B2 | 3/2015 | Ouattara et al. |
| 8,969,934 B1 | 3/2015 | Cheng et al. |
| 8,993,072 B2 | 3/2015 | Xiao et al. |
| 9,117,657 B2 | 8/2015 | Nakano et al. |
| 9,136,108 B2 | 9/2015 | Matsushita et al. |
| 9,171,714 B2 | 10/2015 | Mori et al. |
| 9,214,340 B2 | 12/2015 | Kurita et al. |
| 9,281,223 B2 | 3/2016 | Hara |
| 9,337,031 B2 | 5/2016 | Kim et al. |
| D759,193 S | 6/2016 | Gutierrez et al. |

(56) References Cited

U.S. PATENT DOCUMENTS

| | | |
|---|---|---|
| D761,325 S | 7/2016 | Abed |
| 9,428,833 B1 | 8/2016 | Duvall et al. |
| 9,449,843 B1 | 9/2016 | Korolik et al. |
| 9,449,987 B1 | 9/2016 | Miyata et al. |
| 9,455,138 B1 | 9/2016 | Fukazawa et al. |
| 9,460,954 B2 | 10/2016 | De Jong et al. |
| 9,472,410 B2 | 10/2016 | Sadjadi et al. |
| 9,523,148 B1 | 12/2016 | Pore et al. |
| 9,605,736 B1 | 3/2017 | Foshage et al. |
| D784,276 S | 4/2017 | Tiner et al. |
| 9,618,846 B2 | 4/2017 | Shamma et al. |
| 9,653,267 B2 | 5/2017 | Carducci et al. |
| D793,526 S | 8/2017 | Behdjat |
| D794,753 S | 8/2017 | Miller |
| 9,748,104 B2 | 8/2017 | Sasaki et al. |
| D797,067 S | 9/2017 | Zhang et al. |
| D798,248 S | 9/2017 | Hanson et al. |
| 9,754,818 B2 | 9/2017 | Shiu et al. |
| D800,782 S | 10/2017 | Bever et al. |
| 9,803,926 B2 | 10/2017 | Kikuchi et al. |
| D801,942 S | 11/2017 | Riker et al. |
| D802,472 S | 11/2017 | Sasaki et al. |
| D803,802 S | 11/2017 | Sasaki et al. |
| 9,812,372 B2 | 11/2017 | Choi et al. |
| 9,824,881 B2 | 11/2017 | Niskanen et al. |
| 9,837,355 B2 | 12/2017 | Briggs et al. |
| 9,842,835 B1 | 12/2017 | Cheng et al. |
| 9,847,247 B2 | 12/2017 | Huang et al. |
| 9,850,573 B1 | 12/2017 | Sun |
| D807,494 S | 1/2018 | Kim et al. |
| 9,911,595 B1 | 3/2018 | Smith et al. |
| 9,929,055 B2 | 3/2018 | Dube et al. |
| 9,970,112 B2 | 5/2018 | Koshi et al. |
| 10,018,920 B2 | 7/2018 | Chang et al. |
| D825,505 S | 8/2018 | Hanson et al. |
| D825,614 S | 8/2018 | Bever et al. |
| 10,043,661 B2 | 8/2018 | Kato et al. |
| D829,306 S | 9/2018 | Ikedo et al. |
| D834,686 S | 11/2018 | Yamada et al. |
| 10,179,947 B2 | 1/2019 | Fukazawa |
| 10,229,851 B2 | 3/2019 | Briggs et al. |
| 10,229,985 B1 | 3/2019 | Li et al. |
| D846,008 S | 4/2019 | Geldenhuys et al. |
| D849,055 S | 5/2019 | Kneip |
| 10,332,747 B1 | 6/2019 | Watanabe et al. |
| 10,388,513 B1 | 8/2019 | Blanquart |
| 10,395,963 B2 | 8/2019 | Cooke |
| 10,424,476 B2 | 9/2019 | Suzuki et al. |
| 10,424,477 B2 | 9/2019 | Niskanen et al. |
| D864,134 S | 10/2019 | Watarai et al. |
| 10,435,790 B2 | 10/2019 | Fukazawa et al. |
| 10,510,529 B2 | 12/2019 | Suzuki et al. |
| 10,590,535 B2 | 3/2020 | Huggare |
| D881,338 S | 4/2020 | Chen |
| 10,622,236 B2 | 4/2020 | Kuo et al. |
| 10,662,525 B2 | 5/2020 | Jang et al. |
| 10,704,143 B1 | 7/2020 | Hisamitsu et al. |
| 10,731,249 B2 | 8/2020 | Hatanpää et al. |
| 10,734,497 B2 | 8/2020 | Zhu et al. |
| 10,741,386 B2 | 8/2020 | Chen et al. |
| 10,770,336 B2 | 9/2020 | Hill et al. |
| D913,980 S | 3/2021 | Lee et al. |
| D914,620 S | 3/2021 | Rokkam et al. |
| 10,950,477 B2 | 3/2021 | Lin et al. |
| 11,018,003 B2 | 5/2021 | Huang et al. |
| D922,229 S | 6/2021 | Jun et al. |
| 11,053,584 B2 | 7/2021 | Hsieh et al. |
| 2001/0003271 A1 | 6/2001 | Otsuki |
| 2001/0007244 A1 | 7/2001 | Matsuse |
| 2001/0019347 A1 | 9/2001 | Hauck |
| 2001/0024387 A1 | 9/2001 | Raaijmakers et al. |
| 2001/0027585 A1 | 10/2001 | Lee |
| 2001/0042514 A1 | 11/2001 | Mizuno et al. |
| 2001/0052556 A1 | 12/2001 | Ting et al. |
| 2001/0054381 A1 | 12/2001 | Umotoy et al. |
| 2002/0015853 A1 | 2/2002 | Wataya et al. |
| 2002/0022347 A1 | 2/2002 | Park et al. |
| 2002/0033183 A1 | 3/2002 | Sun et al. |
| 2002/0036065 A1 | 3/2002 | Yamagishi et al. |
| 2002/0047705 A1 | 4/2002 | Tada et al. |
| 2002/0052119 A1 | 5/2002 | Cleemput |
| 2002/0061716 A1 | 5/2002 | Korovin et al. |
| 2002/0079056 A1 | 6/2002 | Kudo et al. |
| 2002/0106909 A1 | 8/2002 | Kato et al. |
| 2002/0108570 A1 | 8/2002 | Lindfors |
| 2002/0117262 A1 | 8/2002 | Pang et al. |
| 2002/0127956 A1 | 9/2002 | Ashjaee et al. |
| 2003/0008602 A1 | 1/2003 | Ashjaee et al. |
| 2003/0013314 A1 | 1/2003 | Ying et al. |
| 2003/0029563 A1 | 2/2003 | Kaushal et al. |
| 2003/0049571 A1 | 3/2003 | Hallock et al. |
| 2003/0049580 A1 | 3/2003 | Goodman |
| 2003/0056726 A1 | 3/2003 | Holst et al. |
| 2003/0075107 A1 | 4/2003 | Miyano et al. |
| 2003/0111012 A1 | 6/2003 | Takeshima |
| 2003/0113995 A1 | 6/2003 | Xia et al. |
| 2003/0132319 A1 | 7/2003 | Hytros et al. |
| 2003/0143846 A1 | 7/2003 | Sekiya et al. |
| 2003/0150386 A1 | 8/2003 | Shimada |
| 2003/0157345 A1 | 8/2003 | Beldi et al. |
| 2003/0168174 A1 | 9/2003 | Foree |
| 2003/0181065 A1 | 9/2003 | O'Donnell |
| 2003/0200926 A1 | 10/2003 | Dando et al. |
| 2003/0205237 A1 | 11/2003 | Sakuma |
| 2003/0232497 A1 | 12/2003 | Xi et al. |
| 2004/0005753 A1 | 1/2004 | Kostamo et al. |
| 2004/0018694 A1 | 1/2004 | Lee et al. |
| 2004/0058517 A1 | 3/2004 | Nallan et al. |
| 2004/0082171 A1 | 4/2004 | Shin et al. |
| 2004/0083962 A1 | 5/2004 | Bang et al. |
| 2004/0099635 A1 | 5/2004 | Nishikawa |
| 2004/0104439 A1 | 6/2004 | Haukka et al. |
| 2004/0112288 A1 | 6/2004 | Whitesell |
| 2004/0118342 A1 | 6/2004 | Cheng et al. |
| 2004/0126929 A1 | 7/2004 | Tang et al. |
| 2004/0154746 A1 | 8/2004 | Park |
| 2004/0163590 A1 | 8/2004 | Tran et al. |
| 2004/0224478 A1 | 11/2004 | Chudzik et al. |
| 2004/0226507 A1 | 11/2004 | Carpenter et al. |
| 2004/0241341 A1 | 12/2004 | Lin |
| 2004/0253790 A1 | 12/2004 | Ootsuka |
| 2004/0261706 A1 | 12/2004 | Lindfors et al. |
| 2005/0006682 A1 | 1/2005 | Bae et al. |
| 2005/0016452 A1 | 1/2005 | Ryu et al. |
| 2005/0023231 A1 | 2/2005 | Huang et al. |
| 2005/0051854 A1 | 3/2005 | Cabral et al. |
| 2005/0062773 A1 | 3/2005 | Fouet |
| 2005/0074576 A1 | 4/2005 | Chaiken et al. |
| 2005/0081786 A1 | 4/2005 | Kubista et al. |
| 2005/0085090 A1 | 4/2005 | Mui et al. |
| 2005/0090123 A1 | 4/2005 | Nishimura et al. |
| 2005/0092439 A1 | 5/2005 | Keeton et al. |
| 2005/0101154 A1 | 5/2005 | Huang |
| 2005/0104112 A1 | 5/2005 | Haukka et al. |
| 2005/0133166 A1 | 6/2005 | Satitpunwaycha et al. |
| 2005/0136657 A1 | 6/2005 | Yokoi et al. |
| 2005/0142361 A1 | 6/2005 | Nakanishi et al. |
| 2005/0153573 A1 | 7/2005 | Okudaira et al. |
| 2005/0164469 A1 | 7/2005 | Haupt |
| 2005/0170306 A1 | 8/2005 | Oosterlaken et al. |
| 2005/0193952 A1 | 9/2005 | Goodman et al. |
| 2005/0285208 A1 | 12/2005 | Ren et al. |
| 2006/0008997 A1 | 1/2006 | Jang et al. |
| 2006/0019495 A1 | 1/2006 | Marcadal et al. |
| 2006/0057858 A1 | 3/2006 | Chung et al. |
| 2006/0097220 A1 | 5/2006 | Kim et al. |
| 2006/0097305 A1 | 5/2006 | Lee |
| 2006/0110930 A1 | 5/2006 | Senzaki |
| 2006/0115589 A1 | 6/2006 | Vukovic |
| 2006/0118241 A1 | 6/2006 | Ohmi et al. |
| 2006/0130751 A1 | 6/2006 | Volfovski et al. |
| 2006/0133955 A1 | 6/2006 | Peters |
| 2006/0141758 A1 | 6/2006 | Naumann et al. |
| 2006/0148151 A1 | 7/2006 | Murthy et al. |

(56) References Cited

U.S. PATENT DOCUMENTS

| | | |
|---|---|---|
| 2006/0156979 A1 | 7/2006 | Thakur et al. |
| 2006/0162661 A1 | 7/2006 | Jung et al. |
| 2006/0176928 A1 | 8/2006 | Nakamura et al. |
| 2006/0193980 A1 | 8/2006 | Hasegawa |
| 2006/0211224 A1 | 9/2006 | Matsuda |
| 2006/0213441 A1 | 9/2006 | Kobrin et al. |
| 2006/0223337 A1 | 10/2006 | Ahn et al. |
| 2006/0249175 A1 | 11/2006 | Nowak et al. |
| 2006/0252244 A1 | 11/2006 | Vaartstra et al. |
| 2007/0026654 A1 | 2/2007 | Huotari et al. |
| 2007/0065597 A1 | 3/2007 | Kaido et al. |
| 2007/0087515 A1 | 4/2007 | Yieh et al. |
| 2007/0092696 A1 | 4/2007 | Tsukatani et al. |
| 2007/0111030 A1 | 5/2007 | Nakano et al. |
| 2007/0123060 A1 | 5/2007 | Rahtu |
| 2007/0128570 A1 | 6/2007 | Goto et al. |
| 2007/0134821 A1 | 6/2007 | Thakur et al. |
| 2007/0144442 A1 | 6/2007 | Migita |
| 2007/0163490 A1 | 7/2007 | Habel et al. |
| 2007/0166459 A1 | 7/2007 | Chang et al. |
| 2007/0205788 A1 | 9/2007 | Natsuhara et al. |
| 2007/0215278 A1 | 9/2007 | Furuse et al. |
| 2007/0222131 A1 | 9/2007 | Fukumoto et al. |
| 2007/0248832 A1 | 10/2007 | Maeda et al. |
| 2007/0264427 A1 | 11/2007 | Shinriki et al. |
| 2007/0264793 A1 | 11/2007 | Oh et al. |
| 2007/0281106 A1 | 12/2007 | Lubomirsky et al. |
| 2008/0032514 A1 | 2/2008 | Sano et al. |
| 2008/0044932 A1 | 2/2008 | Samoilov et al. |
| 2008/0069951 A1 | 3/2008 | Chacin et al. |
| 2008/0092821 A1 | 4/2008 | Otsuka et al. |
| 2008/0110401 A1 | 5/2008 | Fujikawa et al. |
| 2008/0110568 A1 | 5/2008 | Son et al. |
| 2008/0135516 A1 | 6/2008 | Yokogawa et al. |
| 2008/0135936 A1 | 6/2008 | Nakajima |
| 2008/0142046 A1 | 6/2008 | Johnson et al. |
| 2008/0157212 A1 | 7/2008 | Lavoie et al. |
| 2008/0194088 A1 | 8/2008 | Srinivasan et al. |
| 2008/0194113 A1 | 8/2008 | Kim et al. |
| 2008/0210162 A1 | 9/2008 | Yonebayashi |
| 2008/0223725 A1 | 9/2008 | Han et al. |
| 2008/0229811 A1 | 9/2008 | Zhao et al. |
| 2008/0230352 A1 | 9/2008 | Hirata |
| 2008/0237604 A1 | 10/2008 | Alshareef et al. |
| 2008/0246101 A1 | 10/2008 | Li et al. |
| 2008/0276864 A1 | 11/2008 | Koelmel et al. |
| 2008/0293198 A1 | 11/2008 | Kojima et al. |
| 2009/0031954 A1 | 2/2009 | Nishikido et al. |
| 2009/0035463 A1 | 2/2009 | Dip |
| 2009/0035946 A1 | 2/2009 | Pierreux et al. |
| 2009/0060480 A1 | 3/2009 | Herchen |
| 2009/0080136 A1 | 3/2009 | Nagayama et al. |
| 2009/0093100 A1 | 4/2009 | Xia et al. |
| 2009/0117723 A1 | 5/2009 | Kim et al. |
| 2009/0176018 A1 | 7/2009 | Zou et al. |
| 2009/0236315 A1 | 9/2009 | Willwerth et al. |
| 2009/0291566 A1 | 11/2009 | Ueno et al. |
| 2009/0297696 A1 | 12/2009 | Pore et al. |
| 2009/0297731 A1 | 12/2009 | Goundar |
| 2009/0314309 A1 | 12/2009 | Sankarakrishnan et al. |
| 2010/0008656 A1 | 1/2010 | Sorabji et al. |
| 2010/0012153 A1 | 1/2010 | Shigemoto et al. |
| 2010/0031884 A1 | 2/2010 | Aggarwal et al. |
| 2010/0038687 A1 | 2/2010 | Klaus et al. |
| 2010/0075488 A1 | 3/2010 | Collins et al. |
| 2010/0116208 A1 | 5/2010 | Sangam |
| 2010/0119844 A1 | 5/2010 | Sun et al. |
| 2010/0121100 A1 | 5/2010 | Shay |
| 2010/0129670 A1 | 5/2010 | Sun et al. |
| 2010/0133255 A1 | 6/2010 | Bahng et al. |
| 2010/0147396 A1 | 6/2010 | Yamagishi et al. |
| 2010/0163187 A1 | 7/2010 | Yokogawa et al. |
| 2010/0178423 A1 | 7/2010 | Shimizu et al. |
| 2010/0195690 A1 | 8/2010 | Moench et al. |
| 2010/0258809 A1 | 10/2010 | Muller |
| 2010/0322822 A1 | 12/2010 | Fritchie et al. |
| 2011/0089419 A1 | 4/2011 | Yamazaki et al. |
| 2011/0091650 A1 | 4/2011 | Noguchi et al. |
| 2011/0100489 A1 | 5/2011 | Orito et al. |
| 2011/0117728 A1 | 5/2011 | Su et al. |
| 2011/0127702 A1 | 6/2011 | Gautam et al. |
| 2011/0171380 A1 | 7/2011 | Higashi et al. |
| 2011/0186984 A1 | 8/2011 | Saito et al. |
| 2011/0195574 A1 | 8/2011 | Blasco et al. |
| 2011/0212625 A1 | 9/2011 | Toyoda et al. |
| 2011/0237082 A1 | 9/2011 | Nakajima et al. |
| 2011/0254138 A1* | 10/2011 | Babich .............. H01L 21/02274 438/758 |
| 2011/0256692 A1 | 10/2011 | Tam et al. |
| 2011/0286819 A1 | 11/2011 | Shibata et al. |
| 2011/0297088 A1 | 12/2011 | Song et al. |
| 2011/0305856 A1 | 12/2011 | Bonn |
| 2011/0318142 A1 | 12/2011 | Gage et al. |
| 2012/0003599 A1 | 1/2012 | Patalay et al. |
| 2012/0027547 A1 | 2/2012 | Jager et al. |
| 2012/0055401 A1 | 3/2012 | Tozawa |
| 2012/0077350 A1 | 3/2012 | Miya et al. |
| 2012/0088369 A1 | 4/2012 | Weidman et al. |
| 2012/0094010 A1 | 4/2012 | Sugiura et al. |
| 2012/0108039 A1 | 5/2012 | Zojaji et al. |
| 2012/0111271 A1 | 5/2012 | Begarney et al. |
| 2012/0177845 A1 | 7/2012 | Odedra et al. |
| 2012/0187375 A1 | 7/2012 | Guo et al. |
| 2012/0196242 A1 | 8/2012 | Volfovski et al. |
| 2012/0219735 A1 | 8/2012 | Bakker et al. |
| 2012/0222813 A1 | 9/2012 | Pal et al. |
| 2012/0231611 A1 | 9/2012 | Gatineau et al. |
| 2012/0263875 A1 | 10/2012 | Brenninger et al. |
| 2012/0269962 A1 | 10/2012 | Blomberg et al. |
| 2012/0270384 A1 | 10/2012 | Sanchez et al. |
| 2012/0270407 A1 | 10/2012 | Werner et al. |
| 2012/0276306 A1 | 11/2012 | Ueda |
| 2012/0320491 A1 | 12/2012 | Doh et al. |
| 2012/0329208 A1 | 12/2012 | Pore et al. |
| 2013/0011630 A1 | 1/2013 | Sullivan et al. |
| 2013/0012003 A1 | 1/2013 | Haukka et al. |
| 2013/0017503 A1 | 1/2013 | De Ridder et al. |
| 2013/0037532 A1 | 2/2013 | Volfovski et al. |
| 2013/0059415 A1 | 3/2013 | Kato et al. |
| 2013/0062839 A1 | 3/2013 | Tschinderle et al. |
| 2013/0068391 A1 | 3/2013 | Mazzocco et al. |
| 2013/0075788 A1 | 3/2013 | Tomabechi |
| 2013/0085618 A1 | 4/2013 | Ding |
| 2013/0089988 A1 | 4/2013 | Wang et al. |
| 2013/0109172 A1 | 5/2013 | Collins et al. |
| 2013/0109192 A1 | 5/2013 | Hawkins et al. |
| 2013/0147050 A1 | 6/2013 | Bonner, III et al. |
| 2013/0149874 A1 | 6/2013 | Hirose et al. |
| 2013/0162142 A1 | 6/2013 | Nishino et al. |
| 2013/0203258 A1 | 8/2013 | Chen et al. |
| 2013/0206066 A1 | 8/2013 | Han et al. |
| 2013/0213300 A1 | 8/2013 | Sung et al. |
| 2013/0216710 A1 | 8/2013 | Masuda et al. |
| 2013/0220550 A1 | 8/2013 | Koo et al. |
| 2013/0230987 A1 | 9/2013 | Draeger et al. |
| 2013/0247937 A1 | 9/2013 | Nunomura et al. |
| 2013/0270600 A1 | 10/2013 | Helander et al. |
| 2013/0273330 A1 | 10/2013 | Wang et al. |
| 2014/0024223 A1 | 1/2014 | Kilpi et al. |
| 2014/0057187 A1 | 2/2014 | Suzuki et al. |
| 2014/0080314 A1 | 3/2014 | Sasajima et al. |
| 2014/0120312 A1 | 5/2014 | He et al. |
| 2014/0127422 A1 | 5/2014 | Shao et al. |
| 2014/0158154 A1 | 6/2014 | Kondo et al. |
| 2014/0170320 A1 | 6/2014 | Yamamoto et al. |
| 2014/0179092 A1 | 6/2014 | Kim |
| 2014/0187022 A1 | 7/2014 | Falster et al. |
| 2014/0190581 A1 | 7/2014 | Nagase et al. |
| 2014/0242808 A1 | 8/2014 | Akiyama et al. |
| 2014/0252710 A1 | 9/2014 | Cuvalci et al. |
| 2014/0256160 A1 | 9/2014 | Wada et al. |
| 2014/0271081 A1 | 9/2014 | Lavitsky et al. |
| 2014/0290573 A1 | 10/2014 | Okabe et al. |
| 2014/0327117 A1 | 11/2014 | Bencher et al. |

(56) References Cited

U.S. PATENT DOCUMENTS

| | | |
|---|---|---|
| 2014/0346600 A1 | 11/2014 | Cheng et al. |
| 2014/0360430 A1 | 12/2014 | Armour et al. |
| 2015/0004806 A1 | 1/2015 | Ndiege et al. |
| 2015/0024567 A1 | 1/2015 | Tsai et al. |
| 2015/0030782 A1 | 1/2015 | Ivanov et al. |
| 2015/0061078 A1 | 3/2015 | Abel et al. |
| 2015/0069354 A1 | 3/2015 | Helander et al. |
| 2015/0104575 A1 | 4/2015 | Takoudis et al. |
| 2015/0110968 A1 | 4/2015 | Lavoie et al. |
| 2015/0126036 A1 | 5/2015 | Zhao |
| 2015/0132953 A1 | 5/2015 | Nowling et al. |
| 2015/0137315 A1 | 5/2015 | Chen et al. |
| 2015/0155140 A1 | 6/2015 | Lee et al. |
| 2015/0155370 A1 | 6/2015 | Tsai et al. |
| 2015/0170907 A1 | 6/2015 | Haukka et al. |
| 2015/0176124 A1 | 6/2015 | Greer et al. |
| 2015/0247259 A1 | 9/2015 | Hekmatshoar-Tabari et al. |
| 2015/0249013 A1 | 9/2015 | Arghavani et al. |
| 2015/0267299 A1 | 9/2015 | Hawkins et al. |
| 2015/0275355 A1 | 10/2015 | Mallikarjunan et al. |
| 2015/0307989 A1 | 10/2015 | Lindfors |
| 2015/0311043 A1 | 10/2015 | Sun et al. |
| 2015/0340266 A1 | 11/2015 | Ngo et al. |
| 2016/0005596 A1* | 1/2016 | Behera .............. H01L 21/02115 438/703 |
| 2016/0010208 A1 | 1/2016 | Huang et al. |
| 2016/0032453 A1 | 2/2016 | Qian et al. |
| 2016/0035542 A1 | 2/2016 | Hausmann |
| 2016/0086811 A1 | 3/2016 | Mackedanz et al. |
| 2016/0101979 A1* | 4/2016 | Hocke .................. C01B 32/168 427/213 |
| 2016/0111304 A1 | 4/2016 | Takahashi et al. |
| 2016/0133504 A1 | 5/2016 | Chu et al. |
| 2016/0152649 A1 | 6/2016 | Gordon |
| 2016/0168704 A1 | 6/2016 | Choi et al. |
| 2016/0169766 A1 | 6/2016 | Ishibashi et al. |
| 2016/0204005 A1 | 7/2016 | Oki et al. |
| 2016/0204436 A1 | 7/2016 | Barker et al. |
| 2016/0211166 A1 | 7/2016 | Yan et al. |
| 2016/0215387 A1 | 7/2016 | Liu et al. |
| 2016/0225588 A1 | 8/2016 | Shaikh et al. |
| 2016/0237559 A1 | 8/2016 | Tsuji |
| 2016/0273095 A1 | 9/2016 | Lin et al. |
| 2016/0273128 A1 | 9/2016 | Kang |
| 2016/0279629 A1 | 9/2016 | Michishita et al. |
| 2016/0293609 A1 | 10/2016 | Jha et al. |
| 2016/0307740 A1 | 10/2016 | Kim et al. |
| 2016/0314960 A1 | 10/2016 | Cheng et al. |
| 2016/0343612 A1 | 11/2016 | Wang et al. |
| 2016/0376701 A1 | 12/2016 | Takewaki et al. |
| 2017/0022612 A1 | 1/2017 | Lei et al. |
| 2017/0040146 A1 | 2/2017 | Huang et al. |
| 2017/0040198 A1 | 2/2017 | Lin et al. |
| 2017/0062224 A1 | 3/2017 | Fu et al. |
| 2017/0102612 A1 | 4/2017 | Meyers et al. |
| 2017/0140924 A1 | 5/2017 | Suzuki et al. |
| 2017/0167023 A1 | 6/2017 | Proia et al. |
| 2017/0178939 A1 | 6/2017 | Omori |
| 2017/0178942 A1 | 6/2017 | Sakata et al. |
| 2017/0191685 A1 | 7/2017 | Ronne et al. |
| 2017/0213960 A1 | 7/2017 | de Araujo et al. |
| 2017/0218515 A1 | 8/2017 | Shin et al. |
| 2017/0222008 A1 | 8/2017 | Hsu et al. |
| 2017/0253968 A1 | 9/2017 | Yahata |
| 2017/0256393 A1 | 9/2017 | Kim et al. |
| 2017/0263438 A1 | 9/2017 | Li et al. |
| 2017/0271143 A1 | 9/2017 | Fukiage et al. |
| 2017/0283312 A1 | 10/2017 | Lee et al. |
| 2017/0283313 A1 | 10/2017 | Lee et al. |
| 2017/0306494 A1 | 10/2017 | Lin et al. |
| 2017/0314125 A1 | 11/2017 | Fenwick et al. |
| 2017/0369993 A1 | 12/2017 | Sun |
| 2018/0047621 A1 | 2/2018 | Armini |
| 2018/0094350 A1 | 4/2018 | Verghese et al. |
| 2018/0096821 A1 | 4/2018 | Lubomirsky |
| 2018/0096844 A1 | 4/2018 | Dutartre et al. |
| 2018/0105701 A1 | 4/2018 | Larsson et al. |
| 2018/0119283 A1 | 5/2018 | Fukazawa et al. |
| 2018/0171472 A1 | 6/2018 | Yamada et al. |
| 2018/0209042 A1 | 7/2018 | Wu et al. |
| 2018/0265294 A1 | 9/2018 | Hayashi |
| 2018/0265972 A1 | 9/2018 | Firouzdor et al. |
| 2018/0265973 A1 | 9/2018 | Firouzdor et al. |
| 2018/0274098 A1 | 9/2018 | Takagi et al. |
| 2018/0315597 A1 | 11/2018 | Varadarajan et al. |
| 2018/0327892 A1 | 11/2018 | Wu et al. |
| 2018/0327898 A1 | 11/2018 | Wu et al. |
| 2018/0327899 A1 | 11/2018 | Wu et al. |
| 2019/0019714 A1 | 1/2019 | Kosakai et al. |
| 2019/0035698 A1 | 1/2019 | Tanaka |
| 2019/0078206 A1 | 3/2019 | Wu et al. |
| 2019/0109043 A1 | 4/2019 | Wang et al. |
| 2019/0115451 A1 | 4/2019 | Lee et al. |
| 2019/0148177 A1 | 5/2019 | Yin et al. |
| 2019/0148556 A1 | 5/2019 | Wang et al. |
| 2019/0172701 A1 | 6/2019 | Jia et al. |
| 2019/0172714 A1 | 6/2019 | Bobek et al. |
| 2019/0176435 A1 | 6/2019 | Bellman et al. |
| 2019/0198297 A1 | 6/2019 | Aramaki et al. |
| 2019/0211450 A1 | 7/2019 | Adachi et al. |
| 2019/0233446 A1 | 8/2019 | MacDonald et al. |
| 2019/0318910 A1 | 10/2019 | Mori |
| 2019/0319100 A1 | 10/2019 | Chen et al. |
| 2019/0362970 A1 | 11/2019 | Wang et al. |
| 2019/0362989 A1 | 11/2019 | Reuter et al. |
| 2019/0363015 A1 | 11/2019 | Cheng et al. |
| 2019/0378711 A1 | 12/2019 | Suzuki et al. |
| 2019/0393304 A1 | 12/2019 | Guillorn et al. |
| 2020/0012081 A1 | 1/2020 | Komai |
| 2020/0035489 A1 | 1/2020 | Huang et al. |
| 2020/0052089 A1 | 2/2020 | Yu et al. |
| 2020/0058469 A1 | 2/2020 | Ranjan et al. |
| 2020/0066512 A1 | 2/2020 | Tois et al. |
| 2020/0105895 A1 | 4/2020 | Tang et al. |
| 2020/0119038 A1 | 4/2020 | Hopkins et al. |
| 2020/0135915 A1 | 4/2020 | Savant et al. |
| 2020/0185249 A1 | 6/2020 | Rice et al. |
| 2020/0185257 A1 | 6/2020 | Nishiwaki |
| 2020/0203157 A1 | 6/2020 | Su |
| 2020/0273728 A1 | 8/2020 | Benjaminson et al. |
| 2020/0283894 A1 | 9/2020 | Lehn et al. |
| 2020/0312681 A1 | 10/2020 | Tanaka et al. |
| 2020/0373152 A1 | 11/2020 | Blanquart |
| 2020/0395199 A1 | 12/2020 | Miyama |
| 2020/0402846 A1 | 12/2020 | Collins et al. |
| 2021/0013034 A1 | 1/2021 | Wu et al. |
| 2021/0032754 A1 | 2/2021 | White et al. |
| 2021/0033977 A1 | 2/2021 | Raaijmakers et al. |
| 2021/0054500 A1 | 2/2021 | Zope et al. |
| 2021/0054504 A1 | 2/2021 | Wang et al. |
| 2021/0057214 A1 | 2/2021 | Kengoyama et al. |
| 2021/0057223 A1 | 2/2021 | Stevens et al. |
| 2021/0057275 A1 | 2/2021 | Pierreux et al. |
| 2021/0057570 A1 | 2/2021 | Lin et al. |
| 2021/0066075 A1 | 3/2021 | Zhang et al. |
| 2021/0066079 A1 | 3/2021 | Lima et al. |
| 2021/0066080 A1 | 3/2021 | Mattinen et al. |
| 2021/0066083 A1 | 3/2021 | Haukka |
| 2021/0066084 A1 | 3/2021 | Raisanen et al. |
| 2021/0070783 A1 | 3/2021 | Odedra et al. |
| 2021/0071296 A1 | 3/2021 | Watarai et al. |
| 2021/0071298 A1 | 3/2021 | Maes et al. |
| 2021/0074527 A1 | 3/2021 | Lee et al. |
| 2021/0082692 A1 | 3/2021 | Kikuchi |
| 2021/0090878 A1 | 3/2021 | Kang et al. |
| 2021/0095372 A1 | 4/2021 | Minjauw et al. |
| 2021/0102289 A1 | 4/2021 | Tsuji et al. |
| 2021/0102290 A1 | 4/2021 | Acosta et al. |
| 2021/0102292 A1 | 4/2021 | Lin et al. |
| 2021/0104384 A1 | 4/2021 | Parkhe |
| 2021/0104399 A1 | 4/2021 | Kuroda et al. |
| 2021/0108328 A1 | 4/2021 | Yanagisawa |
| 2021/0111025 A1 | 4/2021 | Zyulkov et al. |
| 2021/0111053 A1 | 4/2021 | De Ridder |

(56) References Cited

U.S. PATENT DOCUMENTS

| | | |
|---|---|---|
| 2021/0118667 A1 | 4/2021 | Fukazawa et al. |
| 2021/0118679 A1 | 4/2021 | Lima et al. |
| 2021/0118687 A1 | 4/2021 | Wang et al. |
| 2021/0125827 A1 | 4/2021 | Khazaka et al. |
| 2021/0125832 A1 | 4/2021 | Bhatnagar |
| 2021/0134588 A1 | 5/2021 | Kohen et al. |
| 2021/0134959 A1 | 5/2021 | Lima et al. |
| 2021/0140043 A1 | 5/2021 | Thombare et al. |
| 2021/0143003 A1 | 5/2021 | Fukuda et al. |
| 2021/0151315 A1 | 5/2021 | Pierreux et al. |
| 2021/0151348 A1 | 5/2021 | Utsuno et al. |
| 2021/0151352 A1 | 5/2021 | Zope et al. |
| 2021/0156024 A1 | 5/2021 | Roh et al. |
| 2021/0156030 A1 | 5/2021 | Shugrue |
| 2021/0159077 A1 | 5/2021 | Longrie et al. |
| 2021/0166910 A1 | 6/2021 | Kim et al. |
| 2021/0166924 A1 | 6/2021 | Moon et al. |
| 2021/0166925 A1 | 6/2021 | Moon et al. |
| 2021/0166940 A1 | 6/2021 | Nozawa |
| 2021/0172064 A1 | 6/2021 | Moon |
| 2021/0175052 A1 | 6/2021 | Takahashi et al. |
| 2021/0180184 A1 | 6/2021 | Verni et al. |
| 2021/0180188 A1 | 6/2021 | Kim et al. |
| 2021/0180189 A1 | 6/2021 | Shugrue et al. |
| 2021/0184111 A1* | 6/2021 | Chiang ............... H10N 70/231 |
| 2021/0193458 A1 | 6/2021 | Salmi et al. |
| 2021/0205758 A1 | 7/2021 | Kimtee et al. |
| 2021/0207269 A1 | 7/2021 | Huang et al. |
| 2021/0207270 A1 | 7/2021 | de Ridder et al. |
| 2021/0210373 A1 | 7/2021 | Singu et al. |
| 2021/0214842 A1 | 7/2021 | Yoon et al. |
| 2021/0225615 A1 | 7/2021 | Yoshida |
| 2021/0225622 A1 | 7/2021 | Shoji |
| 2021/0225642 A1 | 7/2021 | Utsuno et al. |
| 2021/0225643 A1 | 7/2021 | Kuroda et al. |
| 2021/0230744 A1 | 7/2021 | Kimtee et al. |
| 2021/0230746 A1 | 7/2021 | Shiba |
| 2021/0233772 A1 | 7/2021 | Zhu et al. |
| 2021/0238736 A1 | 8/2021 | Butail et al. |
| 2021/0238742 A1 | 8/2021 | Susa et al. |
| 2021/0239614 A1 | 8/2021 | Muralidhar et al. |
| 2021/0242011 A1 | 8/2021 | Shero et al. |
| 2021/0246556 A1 | 8/2021 | Mori |
| 2021/0247693 A1 | 8/2021 | Maes et al. |
| 2021/0249303 A1 | 8/2021 | Blanquart |
| 2021/0254216 A1 | 8/2021 | Mori et al. |
| 2021/0254238 A1 | 8/2021 | Khazaka et al. |
| 2021/0257213 A1 | 8/2021 | Kikuchi et al. |
| 2021/0257509 A1 | 8/2021 | Nishiwaki |
| 2021/0265134 A1 | 8/2021 | Singh et al. |
| 2021/0265158 A1 | 8/2021 | Kaneko |
| 2021/0268554 A1 | 9/2021 | Mori |
| 2021/0269914 A1 | 9/2021 | Väyrynen et al. |
| 2021/0272821 A1 | 9/2021 | Oosterlaken |
| 2021/0273109 A1 | 9/2021 | Yamazaki et al. |
| 2021/0280448 A1 | 9/2021 | Ganguli et al. |
| 2021/0285102 A1 | 9/2021 | Yoon et al. |
| 2021/0287878 A1 | 9/2021 | Um et al. |
| 2021/0287912 A1 | 9/2021 | Shiba et al. |
| 2021/0287928 A1 | 9/2021 | Kim et al. |
| 2021/0288476 A1 | 9/2021 | Wei |
| 2021/0292902 A1 | 9/2021 | Kajbafvala et al. |
| 2021/0296130 A1 | 9/2021 | Longrie et al. |
| 2021/0296144 A1 | 9/2021 | Lin et al. |
| 2021/0310125 A1 | 10/2021 | Ma et al. |
| 2021/0313150 A1 | 10/2021 | Kang et al. |
| 2021/0313167 A1 | 10/2021 | Pore et al. |
| 2021/0313170 A1 | 10/2021 | Suzuki |
| 2021/0313178 A1 | 10/2021 | Nakano |
| 2021/0313182 A1 | 10/2021 | Zhu et al. |
| 2021/0317576 A1 | 10/2021 | Väyrynen et al. |
| 2021/0319982 A1 | 10/2021 | Kim et al. |
| 2021/0320003 A1 | 10/2021 | Sugiura et al. |
| 2021/0320010 A1 | 10/2021 | Wang et al. |
| 2021/0320020 A1 | 10/2021 | Oosterlaken et al. |
| 2021/0324510 A1 | 10/2021 | Kuwano et al. |
| 2021/0324518 A1 | 10/2021 | de Ridder |
| 2021/0327704 A1 | 10/2021 | Kajbafvala et al. |
| 2021/0327714 A1 | 10/2021 | Lee et al. |
| 2021/0327715 A1 | 10/2021 | Xie et al. |
| 2021/0328036 A1 | 10/2021 | Li et al. |

FOREIGN PATENT DOCUMENTS

| | | | | |
|---|---|---|---|---|
| CN | 102094183 | | 6/2011 | |
| CN | 102539019 | | 9/2013 | |
| CN | 203721699 | | 7/2014 | |
| CN | 104307264 | | 1/2015 | |
| CN | 104498895 | | 4/2015 | |
| CN | 104517892 | | 4/2015 | |
| CN | 204629865 | | 9/2015 | |
| CN | 205448240 | | 8/2016 | |
| CN | 104342637 | | 2/2017 | |
| CN | 206145834 | | 5/2017 | |
| CN | 104233226 | | 6/2017 | |
| CN | 106895521 | | 6/2017 | |
| CN | 104630735 | | 12/2017 | |
| CN | 107675144 | | 2/2018 | |
| CN | 106011785 | | 10/2018 | |
| CN | 108910843 | | 11/2018 | |
| CN | 109000352 | | 12/2018 | |
| CN | 109573996 A | * | 4/2019 | ........... C01B 32/198 |
| EP | 0634785 | | 1/1995 | |
| FR | 2708624 | | 2/1995 | |
| GB | 400010 | | 10/1933 | |
| GB | 1488948 A | * | 10/1977 | |
| GB | 2051875 | | 1/1981 | |
| JP | S5979545 | | 5/1984 | |
| JP | S59127847 | | 7/1984 | |
| JP | S60110133 | | 6/1985 | |
| JP | H0165766 | | 6/1989 | |
| JP | H01185176 | | 7/1989 | |
| JP | H01313954 | | 12/1989 | |
| JP | H03211753 | | 9/1991 | |
| JP | 2002019009 A | * | 1/2002 | |
| JP | 2002118066 | | 4/2002 | |
| JP | 2004088077 | | 3/2004 | |
| JP | 2004244298 | | 9/2004 | |
| JP | 2005033221 | | 9/2004 | |
| JP | 2006124831 | | 5/2006 | |
| JP | 2015021175 | | 2/2015 | |
| JP | 2017220011 | | 12/2017 | |
| KR | 20000000946 | | 1/2000 | |
| KR | 100273261 | | 12/2000 | |
| KR | 20070041701 | | 4/2007 | |
| KR | 10-2007-0117817 | | 12/2007 | |
| KR | 10-2010-0015073 | | 2/2010 | |
| KR | 10-2010-0122701 | | 11/2010 | |
| KR | 10-2011-0058534 | | 6/2011 | |
| KR | 10-2013-0129149 | | 11/2013 | |
| KR | 101758892 | | 7/2017 | |
| TW | 201213596 | | 4/2012 | |
| TW | 201234453 | | 8/2012 | |
| TW | 201531587 A | | 8/2015 | |
| WO | 2004007800 | | 1/2004 | |
| WO | 2007088940 | | 8/2007 | |
| WO | 2013177269 | | 11/2013 | |
| WO | 2015127614 | | 9/2015 | |
| WO | 2016019795 | | 2/2016 | |
| WO | 2017125401 | | 7/2017 | |
| WO | 2019142055 | | 7/2019 | |
| WO | 2019214578 | | 11/2019 | |
| WO | 2020118100 | | 6/2020 | |
| WO | 2021072042 | | 4/2021 | |

OTHER PUBLICATIONS

Mattox, "Handbook of Physical Vapor Deposition (PVD) Processing—5.5.16 Helicon Plasma Source" 2010, p. 157-193 (Year: 2010).*
JP-2002019009-A, machine translation, originally published 2002, p. 1-11 (Year: 2002).*
CN-109573996-A, machine translation, originally published 2019, p. 1-14 (Year: 2019).*

(56) References Cited

OTHER PUBLICATIONS

Wang, J., et al., "Deposition of carbon nitride film from single-source s-triazine precursors", 2003, Carbon, 41, p. 2031-2037 (Year: 2003).*
CNIPA; Office Action dated Mar. 30, 2021 in Application No. 201610131743.1.
CNIPA; Office Action dated Mar. 1, 2021 in Application No. 201710131319.1.
CNIPA; Notice of Allowance dated Mar. 30, 2021 in Application No. 201710762817.6.
CNIPA; Office Action dated Jan. 28, 2021 in Application No. 201711057557.9.
CNIPA; Office Action dated Jan. 26, 2021 in Application No. 201711057929.8.
CNIPA; Office Action dated Apr. 19, 2021 in Application No. 201711328250.8.
CNIPA; Notice of Allowance dated Apr. 7, 2021 in Application No. 201780044761.9.
CNIPA; Office Action dated Jan. 29, 2021 in Application No. 201780076230.8.
CNIPA; Office Action dated Jan. 27, 2021 in Application No. 201780076321.1.
CNIPA; Office Action dated Mar. 24, 2021 in Application No. 201880048547.5.
CNIPA; Office Action dated Dec. 22, 2020 in Application No. 201910378791.4.
CNIPA; Notice of Allowance dated Apr. 7, 2021 in Application No. 202030579755.8.
EPO; Extended European Search Report dated Apr. 6, 2021 in Application No. 21150514.4.
JPO; Notice of Allowance dated Apr. 6, 2021 in Application No. 2017-139817.
JPO; Office Action dated Mar. 31, 2021 in Application No. 2018-024655.
JPO; Notice of Allowance dated Mar. 17, 2021 in Application No. 2020-010953.
KIPO; Office Action dated Mar. 23, 2021 in Application No. 10-2014-0011765.
KIPO; Office Action dated Apr. 27, 2021 in Application No. 10-2014-0027217.
KIPO; Notice of Allowance dated Apr. 15, 2021 in Application No. 10-2014-0103853.
KIPO; Notice of Allowance dated Mar. 25, 2021 in Application No. 10-2014-0128626.
KIPO; Office Action dated Apr. 20, 2021 in Application No. 10-2014-0136089.
KIPO; Office Action dated Mar. 19, 2021 in Application No. 10-2014-0156196.
KIPO; Office Action dated Mar. 29, 2021 in Application No. 10-2014-0165685.
KIPO; Office Action dated Apr. 5, 2021 in Application No. 10-2015-0031720.
KIPO; Office Action dated Apr. 19, 2021 in Application No. 10-2015-0035094.
KIPO; Office Action dated Mar. 8, 2021 in Application No. 10-2017-0054647.
KIPO; Office Action dated Mar. 10, 2021 in Application No. 10-2017-0055703.
KIPO; Notice of Allowance dated May 24, 2021 in Application No. 10-2020-0101096.
KIPO; Notice of Allowance dated Apr. 1, 2021 in Application No. 30-2020-0030139 (M001).
KIPO; Notice of Allowance dated Apr. 1, 2021 in Application No. 30-2020-0030139 (M002).
TIPO; Notice of Allowance dated May 13, 2021 in Application No. 105122394.
TIPO; Notice of Allowance dated Mar. 5, 2021 in Application No. 105131284.
TIPO; Office Action dated Feb. 25, 2021 in Application No. 105134275.
TIPO; Notice of Allowance dated Mar. 4, 2021 in Application No. 106100823.
TIPO; Notice of Allowance dated May 6, 2021 in Application No. 106108522.
TIPO; Notice of Allowance dated Mar. 4, 2021 in Application No. 106111693.
TIPO; Office Action dated Feb. 25, 2021 in Application No. 106121797.
TIPO; Office Action dated Apr. 26, 2021 in Application No. 106122231.
TIPO; Office Action dated Apr. 22, 2021 in Application No. 106124126.
TIPO; Office Action dated Apr. 22, 2021 in Application No. 106124128.
TIPO; Notice of Allowance dated Mar. 25, 2021 in Application No. 106124130.
TIPO; Office Action dated Mar. 4, 2021 in Application No. 106127948.
TIPO; Office Action dated Mar. 15, 2021 in Application No. 106129971.
TIPO; Office Action dated Apr. 7, 2021 in Application No. 106135925.
TIPO; Office Action dated Apr. 7, 2021 in Application No. 106136905.
TIPO; Office Action dated Mar. 29, 2021 in Application No. 106143559.
TIPO; Office Action dated Mar. 31, 2021 in Application No. 106143570.
TIPO; Office Action dated Jan. 15, 2021 in Application No. 108142842.
TIPO; Office Action dated Jan. 25, 2021 in Application No. 108143562.
TIPO; Notice of Allowance dated May 18, 2021 in Application No. 109300595.
TIPO; Notice of Allowance dated Mar. 30, 2021 in Application No. 109305460.
USPTO; Notice of Allowance dated Feb. 10, 2021 in U.S. Appl. No. 14/219,839.
USPTO; Advisory Action dated Apr. 13, 2021 in U.S. Appl. No. 14/829,565.
USPTO; Non-Final Office Action dated May 12, 2021 in U.S. Appl. No. 14/829,565.
USPTO; Final Office Action dated Feb. 24, 2021 in U.S. Appl. No. 15/262,990.
USPTO; Advisory Action dated Apr. 28, 2021 in U.S. Appl. No. 15/262,990.
USPTO; Final Office Action dated Mar. 25, 2021 in U.S. Appl. No. 15/286,503.
USPTO; Advisory Action dated Apr. 30, 2021 in U.S. Appl. No. 15/377,439.
USPTO; Final Office Action dated Jan. 7, 2021 in U.S. Appl. No. 15/380,909.
USPTO; Non-Final Office Action dated Feb. 9, 2021 in U.S. Appl. No. 15/402,993.
USPTO; Final Office Action dated May 21, 2021 in U.S. Appl. No. 15/402,993.
USPTO; Final Office Action dated Jun. 2, 2021 in U.S. Appl. No. 15/611,707.
USPTO; Advisory Action dated Mar. 25, 2021 in U.S. Appl. No. 15/636,307.
USPTO; Non-Final Office Action dated Apr. 21, 2021 in U.S. Appl. No. 15/636,307.
USPTO; Final Office Action dated Mar. 10, 2021 in U.S. Appl. No. 15/690,017.
USPTO; Notice of Allowance dated Apr. 16, 2021 in U.S. Appl. No. 15/691,241.
USPTO; Non-Final Office Action dated Mar. 18, 2021 in U.S. Appl. No. 15/835,328.
USPTO; Notice of Allowance dated Mar. 19, 2021 in U.S. Appl. No. 15/890,037.
USPTO; Final Office Action dated Apr. 19, 2021 in U.S. Appl. No. 15/909,705.
USPTO; Non-Final Office Action dated May 20, 2021 in U.S. Appl. No. 15/917,224.
USPTO; Non-Final Office Action dated Feb. 18, 2021 in U.S. Appl. No. 15/923,834.
USPTO; Advisory Action dated Apr. 28, 2021 in U.S. Appl. No. 15/940,729.

(56) References Cited

OTHER PUBLICATIONS

USPTO; Notice of Allowance dated Apr. 7, 2021 in U.S. Appl. No. 15/940,759.
USPTO; Advisory Action dated Feb. 22, 2021 in U.S. Appl. No. 15/962,980.
USPTO; Final Office Action dated Apr. 13, 2021 in U.S. Appl. No. 15/967,146.
USPTO; Advisory Action dated Jun. 2, 2021 in U.S. Appl. No. 15/967,146.
USPTO; Non-Final Office Action dated Feb. 19, 2021 in U.S. Appl. No. 15/974,948.
USPTO; Non-Final Office Action dated May 25, 2021 in U.S. Appl. No. 15/985,539.
USPTO; Non-Final Office Action dated Apr. 5, 2021 in U.S. Appl. No. 15/996,286.
USPTO; Non-Final Office Action dated Feb. 4, 2021 in U.S. Appl. No. 16/000,109.
USPTO; Non-Final Office Action dated May 19, 2021 in U.S. Appl. No. 16/000,125.
USPTO; Notice of Allowance dated Feb. 5, 2021 in U.S. Appl. No. 16/000,156.
USPTO; Non-Final Office Action dated Mar. 19, 2021 in U.S. Appl. No. 16/004,041.
USPTO; Final Office Action dated Mar. 23, 2021 in U.S. Appl. No. 16/039,817.
USPTO; Advisory Action dated May 28, 2021 in U.S. Appl. No. 16/039,817.
USPTO; Final Office Action dated Mar. 8, 2021 in U.S. Appl. No. 16/042,791.
USPTO; Advisory Action dated May 14, 2021 in U.S. Appl. No. 16/042,791.
USPTO; Notice of Allowance dated Mar. 10, 2021 in U.S. Appl. No. 16/055,532.
USPTO; Final Office Action dated Mar. 23, 2021 in U.S. Appl. No. 16/105,745.
USPTO; Final Office Action dated Mar. 24, 2021 in U.S. Appl. No. 16/105,761.
USPTO; Advisory Action dated May 20, 2021 in U.S. Appl. No. 16/105,761.
USPTO; Final Office Action dated Mar. 18, 2021 in U.S. Appl. No. 16/105,802.
USPTO; Advisory Action dated May 27, 2021 in U.S. Appl. No. 16/105,802.
USPTO; Advisory Action dated Feb. 17, 2021 in U.S. Appl. No. 16/108,950.
USPTO; Non-Final Office Action dated Apr. 13, 2021 in U.S. Appl. No. 16/108,950.
USPTO; Notice of Allowance dated Mar. 23, 2021 in U.S. Appl. No. 16/116,708.
USPTO; Advisory Action dated Mar. 10, 2021 in U.S. Appl. No. 16/117,530.
USPTO; Non-Final Office Action dated Mar. 23, 2021 in U.S. Appl. No. 16/151,074.
USPTO; Final Office Action dated May 6, 2021 in U.S. Appl. No. 16/152,260.
USPTO; Notice of Allowance dated Feb. 24, 2021 in U.S. Appl. No. 16/167,164.
USPTO; Non-Final Office Action dated Feb. 19, 2021 in U.S. Appl. No. 16/172,535.
USPTO; Final Office Action dated May 27, 2021 in U.S. Appl. No. 16/172,535.
USPTO; Advisory Action dated Apr. 5, 2021 in U.S. Appl. No. 16/176,517.
USPTO; Notice of Allowance dated May 13, 2021 in U.S. Appl. No. 16/176,517.
USPTO; Notice of Allowance dated Feb. 19, 2021 in U.S. Appl. No. 16/183,258.
USPTO; Notice of Allowance dated Feb. 10, 2021 in U.S. Appl. No. 16/205,899.
USPTO; Non-Final Office Action dated Mar. 29, 2021 in U.S. Appl. No. 16/206,589.
USPTO; Advisory Action dated Feb. 25, 2021 in U.S. Appl. No. 16/210,922.
USPTO; Final Office Action dated Mar. 29, 2021 in U.S. Appl. No. 16/219,555.
USPTO; Non-Final Office Action dated May 2, 2021 in U.S. Appl. No. 16/240,392.
USPTO; Advisory Action dated Jan. 26, 2021 in U.S. Appl. No. 16/251,534.
USPTO; Non-Final Office Action dated Feb. 23, 2021 in U.S. Appl. No. 16/251,534.
USPTO; Non-Final Office Action dated Mar. 30, 2021 in U.S. Appl. No. 16/252,567.
USPTO; Non-Final Office Action dated Mar. 4, 2021 in U.S. Appl. No. 16/252,569.
USPTO; Non-Final Office Action dated Apr. 20, 2021 in U.S. Appl. No. 16/397,045.
USPTO; Notice of Allowance dated Mar. 10, 2021 in U.S. Appl. No. 16/400,814.
USPTO; Non-Final Office Action dated May 7, 2021 in U.S. Appl. No. 16/423,824.
USPTO; Notice of Allowance dated Apr. 28, 2021 in U.S. Appl. No. 16/453,249.
USPTO; Final Office Action dated May 20, 2021 in U.S. Appl. No. 16/468,258.
USPTO; Notice of Allowance dated Apr. 26, 2021 in U.S. Appl. No. 16/517,122.
USPTO; Final Office Action dated May 12, 2021 in U.S. Appl. No. 16/546,543.
USPTO; Non-Final Office Action dated Feb. 1, 2021 in U.S. Appl. No. 16/563,473.
USPTO; Non-Final Office Action dated May 10, 2021 in U.S. Appl. No. 16/601,593.
USPTO; Non-Final Office Action dated Feb. 24, 2021 in U.S. Appl. No. 16/637,134.
USPTO; Notice of Allowance dated Jun. 2, 2021 in U.S. Appl. No. 16/637,134.
USPTO; Notice of Allowance dated Apr. 30, 2021 in U.S. Appl. No. 16/685,787.
USPTO; Non-Final Office Action dated Apr. 5, 2021 in U.S. Appl. No. 16/704,835.
USPTO; Final Office Action dated Feb. 22, 2021 in U.S. Appl. No. 16/713,311.
USPTO; Notice of Allowance dated May 20, 2021 in U.S. Appl. No. 16/752,514.
USPTO; Notice of Allowance dated May 24, 2021 in U.S. Appl. No. 16/765,125.
USPTO; Non-Final Office Action dated Apr. 15, 2021 in U.S. Appl. No. 16/789,138.
USPTO; Notice of Allowance dated May 12, 2021 in U.S. Appl. No. 16/800,114.
USPTO; Non-Final Office Action dated Apr. 5, 2021 in U.S. Appl. No. 16/816,078.
USPTO; Non-Final Office Action dated May 19, 2021 in U.S. Appl. No. 16/828,753.
USPTO; Non-Final Office Action dated May 4, 2021 in U.S. Appl. No. 16/872,045.
USPTO; Non-Final Office Action dated May 3, 2021 in U.S. Appl. No. 16/878,443.
USPTO; Non-Final Office Action dated Dec. 31, 2020 in U.S. Appl. No. 16/924,595.
USPTO; Non-Final Office Action dated May 25, 2021 in U.S. Appl. No. 16/935,280.
USPTO; Non-Final Office Action dated Apr. 14, 2021 in U.S. Appl. No. 17/009,093.
USPTO; Ex Parte Quayle Action dated Apr. 13, 2021 in U.S. Appl. No. 29/679,620.
USPTO; Notice of Allowance dated May 19, 2021 in U.S. Appl. No. 29/702,881.
Aubin et al. "Very low temperature (450° C.) selective epitaxial growth of heavily in situ boron-doped SiGe layers" Semiconductor Science and Technology, 30, 10 pages (2015).

(56) References Cited

OTHER PUBLICATIONS

Barnscheidt et al. "Highly boron-doped germanium layers on Si(001) grown by carbon-mediated epitaxy" Semiconductor Science and Technology, 33, 9 pages (2018).
Belyansky et al. "Low Temperature Borophosphosilicate Glass (BPSG) Process for High Aspect Ratio Gap Fill" www.electrochem.org/dl/ma/201/pdfs/0705.pdf, downloaded May 15, 2021, 1 page.
Cheremisin et al. "UV-laser modification and selective ion-beam etching of amorphous vanadium pentoxide thin films" Phys. Status Solidi A, Applications and materials science, 206 (7), pp. 1484-1487 (2009).
Dingemans et al. "Plasma-Assisted ALD for the Conformal Deposition of SiO2: Process, Material and Electronic Properties" J of the Electrochemical Society, 159(3), H277-H285 (2012).
G02-1152 "Atomic Layer Deposition of Al2O3 with Alcohol Oxidants for Impeding Substrate Oxidation" Abstract. Oct. 16, 2019 (2019).
Imamura et al. "Cyclic C4F8 and O2 plasma etching of TiO2 for high-aspect-ratio three-dimensional devices" Template for JJAP Regular Papers, Jan. 2014, p. 29 (2014).
Kim et al. "A process for topographically selective deposition on 3D nanostructures by ion implantation" ACS Nano, 10, 4, 4451-4458 (2016).
Lee et al. "Ultraviolet light enhancement of Ta2O5 dry etch rates" J. of Vacuum Science & Technology B: Microelectronics and Nanometer Structures Processing, Measurement, and Phenomena, 18, pp. 293-295 (2000).
Musschoot et al. "Atomic layer deposition of titanium nitride from TDMAT precursor" Microelectronic Engineering, 86, pp. 72-77 (2009).
Noircler et al. "Transmission electron microscopy characterization of low temperature boron doped silicon epitaxial films" CrystEngComm, 22(33), pp. 5464-5472 (2020).
Oyama et al. "Topotactic synthesis of vanadium nitride solid foams" Journal of Materials Research vol. 8. No. 6, pp. 1450-1454 (1993).
Rimoldi et al. "Atomic Layer Deposition of Rhenium-Aluminum Oxide Thin Films and ReOx Incorporation in a Metal-Organic Framework" Applied Materials & Interfaces, 9, pp. 35067-35074 (2017).
Standard Motor Products LX249 Ignition Pick Up, Nov. 11, 2005, Amazon.com, May 10, 2021. URL: https://www.amazon.com/Standard-Motor-Products-LX249-Ignition/dp/B000C7ZTS4/ (2005).
Tao et al. "Improved performance of GeON as charge storage layer in flash memory by optimal annealing" Microelectronics Reliability, vol. 52, pp. 2597-2601 (2012).
Wirths et al. "Low temperature RPCVD epitaxial growth of Si1xGex using Si2H6 and Ge2H6" Solid-State Electronics, 88, pp. 2-9 (2013).
Yanguas-Gil et al. "Modulation of the Growth Per Cycle in Atomic Layer Deposition Using Reversible Surface Functionalization" Chemistry of Materials, 25, pp. 4849-4860 (2013).
CNIPA; Office Action dated Jul. 21, 2021 in Application No. 201610131743.1.
CNIPA; Office Action dated Jul. 23, 2021 in Application No. 201710131319.1.
CNIPA; Notice of Allowance dated Jun. 3, 2021 in Application No. 201711057929.8.
CNIPA; Office Action dated Sep. 13, 2021 in Application No. 201780076230.8.
CNIPA; Office Action dated Sep. 13, 2021 in Application No. 201780076321.1.
CNIPA; Office Action dated Apr. 30, 2021 in Application No. 201810018936.5.
CNIPA; Office Action dated Apr. 16, 2021 in Application No. 201810116717.0.
CNIPA; Notice of Allowance dated Sep. 15, 2021 in Application No. 201810116717.0.
CNIPA; Office Action dated May 26, 2021 in Application No. 201810215131.X.
CNIPA; Office Action dated Jun. 16, 2021 in Application No. 201810344382.8.
CNIPA; Notice of Allowance dated Oct. 11, 2021 in Application No. 201810344382.8.
CNIPA; Office Action dated Jul. 5, 2021 in Application No. 201810530514.6.
CNIPA; Office Action dated Jun. 30, 2021 in Application No. 201810755771.X.
CNIPA; Office Action dated Sep. 23, 2021 in Application No. 201880048547.5.
CNIPA; Office Action dated May 19, 2021 in Application No. 201880072606.2.
CNIPA; Office Action dated May 31, 2021 in Application No. 201910857144.1.
CNIPA; Office Action dated Jun. 2, 2021 in Application No. 201910920881.1.
CNIPA; Office Action dated Jul. 5, 2021 in Application No. 201911042495.3.
CNIPA; Office Action dated Apr. 27, 2021 in Application No. 201911250100.9.
CNIPA; Office Action dated Jul. 7, 2021 in Application No. 201980011788.7.
CNIPA; Notice of Allowance dated Jun. 16, 2021 in Application No. 202130111248.6.
EPO; Extended European Search Report dated Aug. 11, 2021 in Application No. 21169226.4.
JPO; Notice of Allowance dated Aug. 11, 2021 in Application No. 2018-024655.
JPO; Office Action dated Aug. 2, 2021 in Application No. 2019-504674.
JPO; Office Action dated Sep. 10, 2021 in Application No. 2019-531445.
JPO; Notice of Allowance dated Jun. 30, 2021 in Application No. 2021-004208.
KIPO; Office Action dated Jun. 28, 2021 in Application No. 10-2014-0027217.
KIPO; Notice of Allowance dated May 27, 2021 in Application No. 10-2014-0105478.
KIPO; Notice of Allowance dated Aug. 17, 2021 in Application No. 10-2014-0122903.
KIPO; Notice of Allowance dated Sep. 8, 2021 in Application No. 10-2014-0136089.
KIPO; Notice of Allowance dated Jul. 6, 2021 in Application No. 10-2014-0145220.
KIPO; Notice of Allowance dated Sep. 23, 2021 in Application No. 2014-0156196.
KIPO; Notice of Allowance dated Jul. 21, 2021 in Application No. 10-2015-0025314.
KIPO; Office Action dated May 19, 2021 in Application No. 10-2015-0036819.
KIPO; Office Action dated Jun. 23, 2021 in Application No. 10-2015-0037658.
KIPO; Office Action dated Sep. 6, 2021 in Application No. 10-2015-0046393.
KIPO; Office Action dated Jun. 10, 2021 in Application No. 2015-61391.
KIPO; Office Action dated Sep. 3, 2021 in Application No. 2017-37847.
KIPO; Office Action dated Aug. 2, 2021 in Application No. 2017-43865.
KIPO; Office Action dated Oct. 1, 2021 in Application No. 2017-43919.
KIPO; Office Action dated Sep. 28, 2021 in Application No. 2017-49172.
KIPO; Notice of Allowance dated Sep. 28, 2021 in Application No. 2017-54647.
KIPO; Office Action dated in Aug. 30, 2021 in Application No. 2017-81515.
KIPO; Office Action dated Sep. 10, 2021 in Application No. 2017-86083.
KIPO; Office Action dated Jun. 29, 2021 in Application No. 10-2017-0066979.

(56) References Cited

OTHER PUBLICATIONS

KIPO; Notice of Allowance dated Jun. 24, 2021 in Application No. 10-2019-0044213.
KIPO; Office Action dated Jun. 17, 2021 in Application No. 10-2021-0051860.
KIPO; Office Action dated Aug. 18, 2021 in Application No. 10-2021-0090283.
KIPO; Notice of Allowance dated Sep. 2, 2021 in Application No. 30-2020-0047043.
TIPO; Office Action dated Jun. 22, 2021 in Application No. 104108277.
TIPO; Notice of Allowance dated Sep. 22, 2021 in Application No. 104108277.
TIPO; Office Action dated Jun. 2, 2021 in Application No. 105129977.
TIPO; Notice of Allowance dated Sep. 9, 2021 in Application No. 105129977.
TIPO; Notice of Allowance dated Jun. 4, 2021 in Application No. 105131896.
TIPO; Notice of Allowance dated Jul. 30, 2021 in Application No. 105134275.
TIPO; Notice of Allowance dated Feb. 24, 2021 in Application No. 106113604.
TIPO; Notice of Allowance dated Sep. 3, 2021 in Application No. 106115126.
TIPO; Office Action dated Jun. 21, 2021 in Application No. 106120902.
TIPO; Notice of Allowance dated Jun. 30, 2021 in Application No. 106121797.
TIPO; Notice of Allowance dated Sep. 1, 2021 in Application No. 106122231.
TIPO; Notice of Allowance dated Jun. 3, 2021 in Application No. 106123203.
TIPO; Notice of Allowance dated Aug. 24, 2021 in Application No. 106124129.
TIPO; Notice of Allowance dated Jul. 28, 2021 in Application No. 106129491.
TIPO; Notice of Allowance dated Aug. 10, 2021 in Application No. 106129971.
TIPO; Office Action dated Jun. 15, 2021 in Application No. 106133152.
TIPO; Notice of Allowance dated Oct. 12, 2021 in Application No. 106135925.
TIPO; Office Action dated Jul. 13, 2021 in Application No. 106138996.
TIPO; Notice of Allowance dated Sep. 24, 2021 in Application No. 106143559.
TIPO; Office Action dated Aug. 5, 2021 in Application No. 106143566.
TIPO; Office Action dated May 26, 2021 in Application No. 106143568.
TIPO; Notice of Allowance dated Jul. 30, 2021 in Application No. 106143570.
TIPO; Office Action dated Jun. 7, 2021 in Application No. 107103230.
TIPO; Office Action dated Aug. 10, 2021 in Application No. 107103230.
TIPO; Office Action dated Sep. 8, 2021 in Application No. 107105788.
TIPO; Office Action dated Aug. 3, 2021 in Application No. 107105982.
TIPO; Office Action dated Aug. 16, 2021 in Application No. 107114888.
TIPO; Office Action dated Sep. 28, 2021 in Application No. 109112983.
TIPO; Office Action dated Sep. 13, 2021 in Application No. 109119438.
TIPO; Office Action dated Oct. 18, 2021 in Application No. 109300594.
TIPO; Notice of Allowance dated Jun. 9, 2021 in Application No. 109303437.
TIPO; Notice of Allowance dated Oct. 1, 2021 in Application No. 110118827.
TIPO; Notice of Allowance dated Jun. 30, 2021 in Application No. 110301018.
TIPO; Notice of Allowance dated Jul. 29, 2021 in Application No. 110301101.
TIPO; Notice of Allowance dated Jul. 27, 2021 in Application No. 110302670.
USPTO; Final Office Action dated Aug. 4, 2021 in U.S. Appl. No. 14/219,879.
USPTO; Non-Final Office Action dated Jun. 10, 2021 in U.S. Appl. No. 15/262,990.
USPTO; Final Office Action dated Oct. 1, 2021 in U.S. Appl. No. 15/262,990.
USPTO; Non-Final Office Action dated Jul. 9, 2021 in U.S. Appl. No. 15/286,503.
USPTO; Notice of Allowance dated Jun. 29, 2021 in U.S. Appl. No. 15/377,439.
USPTO; Non-Final Office Action dated Jun. 25, 2021 in U.S. Appl. No. 15/380,909.
USPTO; Final Office Action dated Jun. 21, 2021 in U.S. Appl. No. 15/380,921.
USPTO; Advisory Action dated Aug. 30, 2021 in U.S. Appl. No. 15/380,921.
USPTO; Non-Final Office Action dated Oct. 6, 2021 in U.S. Appl. No. 15/380,921.
USPTO; Advisory Action dated Jul. 27, 2021 in U.S. Appl. No. 15/402,993.
USPTO; Final Office Action dated Jun. 9, 2021 in U.S. Appl. No. 15/491,726.
USPTO; Advisory Action dated Aug. 24, 2021 in U.S. Appl. No. 15/491,726.
USPTO; Non-Final Office Action dated Sep. 28, 2021 in U.S. Appl. No. 15/491,726.
USPTO; Notice of Allowance dated Aug. 25, 2021 in U.S. Appl. No. 15/611,707.
USPTO; Non-Final Office Action dated Sep. 16, 2021 in U.S. Appl. No. 15/636,307.
USPTO; Advisory Action dated Jun. 11, 2021 in U.S. Appl. No. 15/690,017.
USPTO; Non-Final Office Action dated Jun. 17, 2021 in U.S. Appl. No. 15/690,017.
USPTO; Final Office Action dated Jul. 15, 2021 in U.S. Appl. No. 15/726,959.
USPTO; Advisory Action dated Sep. 21, 2021 in U.S. Appl. No. 15/726,959.
USPTO; Notice of Allowance dated Sep. 15, 2021 in U.S. Appl. No. 15/835,328.
USPTO; Advisory Action dated Jun. 11, 2021 in U.S. Appl. No. 15/909,705.
USPTO; Notice of Allowance dated Jun. 4, 2021 in U.S. Appl. No. 15/923,834.
USPTO; Final Office Action dated Jun. 28, 2021 in U.S. Appl. No. 15/925,532.
USPTO; Advisory Action dated Aug. 27, 2021 in U.S. Appl. No. 15/925,532.
USPTO; Non-Final Office Action dated Oct. 6, 2021 in U.S. Appl. No. 15/925,532.
USPTO; Non-Final Office Action dated Jun. 16, 2021 in U.S. Appl. No. 15/940,729.
USPTO; Notice of Allowance dated Sep. 28, 2021 in U.S. Appl. No. 15/940,729.
USPTO; Non-Final Office Action dated Aug. 2, 2021 in U.S. Appl. No. 15/962,980.
USPTO; Non-Final Office Action dated Oct. 4, 2021 in U.S. Appl. No. 15/967,146.
USPTO; Final Office Action dated Aug. 3, 2021 in U.S. Appl. No. 15/974,948.
USPTO; Advisory Action dated Oct. 21, 2021 in U.S. Appl. No. 15/974,948.
USPTO; Final Office Action dated Oct. 12, 2021 in U.S. Appl. No. 15/996,286.
USPTO; Non-Final Office Action dated Jul. 9, 2021 in U.S. Appl. No. 15/997,445.
USPTO; Final Office Action dated Aug. 5, 2021 in U.S. Appl. No. 16/000,109.
USPTO; Final Office Action dated Oct. 20, 2021 in U.S. Appl. No. 16/000,125.
USPTO; Final Office Action dated Sep. 3, 2021 in U.S. Appl. No. 16/004,041.

(56) References Cited

OTHER PUBLICATIONS

USPTO; Non-Final Office Action dated Oct. 22, 2021 in U.S. Appl. No. 16/042,791.
USPTO; Non-Final Office Action dated Sep. 28, 2021 in U.S. Appl. No. 16/105,745.
USPTO; Non-Final Office Action dated Sep. 29, 2021 in U.S. Appl. No. 16/105,761.
USPTO; Non-Final Office Action dated Jun. 25, 2021 in U.S. Appl. No. 16/105,802.
USPTO; Final Office Action dated Jul. 27, 2021 in U.S. Appl. No. 16/108,950.
USPTO; Advisory Action dated Oct. 1, 2021 in U.S. Appl. No. 16/108,950.
USPTO; Non-Final Office Action dated Jun. 18, 2021 in U.S. Appl. No. 16/117,530.
USPTO; Final Office Action dated Jul. 8, 2021 in U.S. Appl. No. 16/151,074.
USPTO; Notice of Allowance dated Sep. 17, 2021 in U.S. Appl. No. 16/151,074.
USPTO; Non-Final Office Action dated Sep. 16, 2021 in U.S. Appl. No. 16/152,260.
USPTO; Advisory Action dated Aug. 2, 2021 in U.S. Appl. No. 16/172,535.
USPTO; Non-Final Office Action dated Oct. 15, 2021 in U.S. Appl. No. 16/172,535.
USPTO; Final Office Action dated Jun. 14, 2021 in U.S. Appl. No. 16/202,941.
USPTO; Advisory Action dated Aug. 16, 2021 in U.S. Appl. No. 16/202,941.
USPTO; Non-Final Office Action dated Sep. 20, 2021 in U.S. Appl. No. 16/202,941.
USPTO; Final Office Action dated Jul. 26, 2021 in U.S. Appl. No. 16/206,589.
USPTO; Notice of Allowance dated Sep. 13, 2021 in U.S. Appl. No. 16/206,589.
USPTO; Non-Final Office Action dated Aug. 25, 2021 in U.S. Appl. No. 16/210,922.
USPTO; Final Office Action dated Sep. 1, 2021 in U.S. Appl. No. 16/240,392.
USPTO; Notice of Allowance dated Oct. 15, 2021 in U.S. Appl. No. 16/240,392.
USPTO; Final Office Action dated Sep. 7, 2021 in U.S. Appl. No. 16/251,534.
USPTO; Final Office Action dated Aug. 18, 2021 in U.S. Appl. No. 16/252,567.
USPTO; Final Office Action dated Jul. 21, 2021 in U.S. Appl. No. 16/252,569.
USPTO; Advisory Action dated Jul. 15, 2021 in U.S. Appl. No. 16/468,258.
USPTO; Non-Final Office Action dated Oct. 21, 2021 in U.S. Appl. No. 16/468,258.
USPTO; Advisory Action dated Jul. 8, 2021 in U.S. Appl. No. 16/546,543.
USPTO; Ex Parte Quayle Action dated Aug. 6, 2021 in U.S. Appl. No. 16/563,473.
USPTO; Notice of Allowance dated Sep. 30, 2021 in U.S. Appl. No. 16/563,473.
USPTO; Non-Final Office Action dated Oct. 5, 2021 in U.S. Appl. No. 16/588,807.
USPTO; Notice of Allowance dated Oct. 18, 2021 in U.S. Appl. No. 16/601,593.
USPTO; Non-Final Office Action dated Jun. 11, 2021 in U.S. Appl. No. 16/671,847.
USPTO; Non-Final Office Action dated Jun. 24, 2021 in U.S. Appl. No. 16/673,860.
USPTO; Non-Final Office Action dated Sep. 28, 2021 in U.S. Appl. No. 16/692,859.
USPTO; Notice of Allowance dated Jul. 20, 2021 in U.S. Appl. No. 16/704,835.
USPTO; Non-Final Office Action dated Aug. 31, 2021 in U.S. Appl. No. 16/712,707.
USPTO; Non-Final Office Action dated Sep. 21, 2021 in U.S. Appl. No. 16/736,336.
USPTO; Final Office Action dated Sep. 15, 2021 in U.S. Appl. No. 16/789,138.
USPTO; Non-Final Office Action dated Jun. 24, 2021 in U.S. Appl. No. 16/792,058.
USPTO; Notice of Allowance dated Oct. 19, 2021 in U.S. Appl. No. 16/792,058.
USPTO; Non-Final Office Action dated Oct. 6, 2021 in U.S. Appl. No. 16/792,544.
USPTO; Notice of Allowance dated Sep. 27, 2021 in U.S. Appl. No. 16/792,571.
USPTO; Non-Final Office Action dated Aug. 17, 2021 in U.S. Appl. No. 16/797,346.
USPTO; Notice of Allowance dated Jul. 21, 2021 in U.S. Appl. No. 16/816,078.
USPTO; Non-Final Office Action dated Jun. 23, 2021 in U.S. Appl. No. 16/827,012.
USPTO; Non-Final Office Action dated Feb. 23, 2021 in U.S. Appl. No. 16/827,506.
USPTO; Notice of Allowance dated May 27, 2021 in U.S. Appl. No. 16/827,506.
USPTO; Final Office Action dated Oct. 6, 2021 in U.S. Appl. No. 16/828,753.
USPTO; Non-Final Office Action dated Jul. 28, 2021 in U.S. Appl. No. 16/835,283.
USPTO; Non-Final Office Action dated Oct. 4, 2021 in U.S. Appl. No. 16/840,960.
USPTO; Non-Final Office Action dated Aug. 3, 2021 in U.S. Appl. No. 16/849,793.
USPTO; Non-Final Office Action dated Jun. 15, 2021 in U.S. Appl. No. 16/861,144.
USPTO; Final Office Action dated Sep. 17, 2021 in U.S. Appl. No. 16/861,144.
USPTO; Non-Final Office Action dated Sep. 1, 2021 in U.S. Appl. No. 16/867,385.
USPTO; Final Office Action dated Oct. 7, 2021 in U.S. Appl. No. 16/872,045.
USPTO; Final Office Action dated Oct. 14, 2021 in U.S. Appl. No. 16/878,443.
USPTO; Non-Final Office Action dated Oct. 4, 2021 in U.S. Appl. No. 16/886,405.
USPTO; Non-Final Office Action dated Jul. 28, 2021 in U.S. Appl. No. 16/888,423.
USPTO; Non-Final Office Action dated Oct. 13, 2021 in U.S. Appl. No. 16/893,206.
USPTO; Notice of Allowance dated Jun. 17, 2021 in U.S. Appl. No. 16/924,595.
USPTO; Non-Final Office Action dated Jul. 27, 2021 in U.S. Appl. No. 16/930,193.
USPTO; Non-Final Office Action dated Jun. 25, 2021 in U.S. Appl. No. 16/930,305.
USPTO; Non-Final Office Action dated Sep. 14, 2021 in U.S. Appl. No. 16/932,707.
USPTO; Non-Final Office Action dated Oct. 4, 2021 in U.S. Appl. No. 16/935,275.
USPTO; Notice of Allowance dated Sep. 22, 2021 in U.S. Appl. No. 16/935,280.
USPTO; Non-Final Office Action dated Aug. 23, 2021 in U.S. Appl. No. 16/938,868.
USPTO; Non-Final Office Action dated Oct. 12, 2021 in U.S. Appl. No. 16/944,763.
USPTO; Non-Final Office Action dated Aug. 19, 2021 in U.S. Appl. No. 16/992,806.
USPTO; Non-Final Office Action dated Jul. 7, 2021 in U.S. Appl. No. 16/999,065.
USPTO; Final Office Action dated Oct. 21, 2021 in U.S. Appl. No. 16/999,065.
USPTO; Final Ofiice Action dated Jul. 23, 2021 in U.S. Appl. No. 17/009,093.

(56) References Cited

OTHER PUBLICATIONS

USPTO; Advisory Action dated Oct. 5, 2021 in U.S. Appl. No. 17/009,093.
USPTO; Non-Final Office Action dated Sep. 28, 2021 in U.S. Appl. No. 17/023,129.
USPTO; Notice of Allowance dated Oct. 14, 2021 in U.S. Appl. No. 17/024,092.
USPTO; Notice of Allowance dated Oct. 4, 2021 in U.S. Appl. No. 17/028,066.
USPTO; Non-Final Office Action dated Sep. 10, 2021 in U.S. Appl. No. 17/038,514.
USPTO; Non-Final Office Action dated Oct. 22, 2021 in U.S. Appl. No. 17/073,544.
USPTO; Non-Final Office Action dated Sep. 30, 2021 in U.S. Appl. No. 17/093,224.
USPTO; Non-Final Office Action dated Sep. 22, 2021 in U.S. Appl. No. 17/126,275.
USPTO; Non-Final Office Action dated Sep. 23, 2021 in U.S. Appl. No. 17/254,111.
USPTO; Non-Final Office Action dated Sep. 27, 2021 in U.S. Appl. No. 17/254,366.
USPTO; Notice of Allowance dated Jul. 1, 2021 in U.S. Appl. No. 29/679,620.
USPTO; Notice of Allowance dated Jul. 9, 2021 in U.S. Appl. No. 29/692,490.
USPTO; Non-Final Office Action dated Jul. 14, 2021 in U.S. Appl. No. 29/695,044.
USPTO; Notice of Allowance dated Jun. 8, 2021 in U.S. Appl. No. 29/696,472.
USPTO; Notice of Allowance dated Sep. 21, 2021 in U.S. Appl. No. 29/702,865.
Alen et al. "Atomic layer deposition of molybdenum nitride thin films for cu metallizations" J of The Electrochemical Society, 152(5) G361-G366 (2005).
Best et al. "Complex Halides of the Transition Metals. 24.1 Reactions of Dimeric Molybdenum (II) Halide Complexes Containing Strong Metal-Metal Bonds with Bidentate Tertiary Phosphines and Arsines" Inorganic Chemistry, vol. 17, No. 1, pp. 99-104 (1978).
Blakeney et al. "Atomic Layer Deposition of Aluminum Metal Films Using a Thermally Stable Aluminum Hydride Reducing Agent" Chem. Mater., 30, pp. 1844-1848 (2018).
Buitrago et al. "SnOx high-efficiency EUV interference lithography gratings towards the ultimate resolution in photolithography" Abstract, 1 page (2016).
Buitrago et al. "State-of-the-art EUV materials and processes for the 7 nm node and beyond" Proc of SPIE, vol. 10143, 8 pages (2017).
Cheng et al. "Improved High-Temperature Leakage in High-Density MIM Capcitors by Using a TiLaO Dielectric and an Ir Electrode" IEEE Electron Device Letters, vol. 28, No. 12, 3 pages (2007).
Firestop Support Plate, Type B, 6 In Apr. 4, 2012, Amazon. Com, May 10, 2021, https://www.amazon.com/AmeriVent-Firestop-Support-Plate-Type/dp/B007R7W951/ (2012).
Gertsch et al. "SF4 as the Fluorination Reactant for Al2O3 and VO2 Thermal Atomic Layer Etching" Chem. Mater., 31, pp. 3624-3635 (2019).
Han et al. "Synthesis and characterization of novel zinc precursors for ZnO thin film deposition by atomic layer deposition" Dalton Transactions 49.14 (2020): 4306-4314.
Hayashi et al. "2,2-Difluoro-1,3-dimethylimidazolidine (DFI). A new fluorinating agent" Chem. Commun. pp. 1618-1619 (2002).
Imai et al. "Energetic stability and magnetic moment of tri-, tetra-, and octa-ferromagnetic element nitrides predicted by first-principle calculations" J of Alloys and Compounds, vol. 611, 19 pages (2019).
Jacoby "Chemical deposition methods to the rescue" Cen. Acs. Org., pp. 29-32 (2018).
Jiang et al. "Sensitizer for EUV Chemically Amplified Resist: Metal versus Halogen" J of Photopolymer Science and Technology, vol. 32, No. 1, pp. 21-25 (2019).
Kang et al. "Optical Performance of Extreme Ultraviolet Lithography Mask with an Indium Tin Oxide Absorber" J of Nanoscience and Nanotechnology, vol. 12, pp. 3330-3333 (2012).
Kim et al. "Atomic layer deposition of transition metals for silicide contact formation: Growth characteristics and silicidation" Microelectronic Engineering, 106, pp. 69-75 (2013).
Lim et al. "Atomic layer deposition of transition metals" Nature Materials, vol. 2 pp. 749-754 (2003).
Maina et al. "Atomic layer deposition of transition metal films and nanostructures for electronic and catalytic applications" Critical Reviews in Solid State and Materials Sciences, Abstract, 2 pages (2020).
Miikkulainen et al. "Crystallinity of inorganic films grown by atomic layer deposition: Overview and general trends" Journal of Applied Physics, 112, 102 pages (2013).
Niskanen et al. "Radical-enhanced atomic layer deposition of metallic copper thin films" Journal of the Electrochemical Society 152(1) pp. G25-G28 (2004).
O'Hanlon "A User's Guide to Vacuum Technology" Third Edition, Chapter 19, pp. 359-378 (2003).
Ovanesyan et al. "Atomic Layer Deposition of SiCxNy Using Si2Cl6 and CH3NH2 Plasma" Chem. Mater. 2017, 29, pp. 6269-6278 (2017).
Park et al. "Superfilling CVD of copper using a catalytic surfactant" Proceedings of the IEEE 2001 International Interconnect Technology Conference, 3 pages (2001).
Petrov et al. "1,1,2,2-Tetrafluoroethyl-N,N-dimethylamine: a new selective fluorinating agent" J of Fluorine Chemistry, 109, pp. 25-31 (2001).
Popov et al. "Atomic Layer Deposition of PbI2 Thin Films" Chem. Mater. 31, pp. 1101-1109 (2019).
Popovici et al. "High-performance (EOT<0.4nm, Jg~10-7 A/cm2) ALD-deposited Ru\SrTiO3 stack for next generations DRAM pillar capacitor" 2018 IEEE International Electron Devices Meeting (IEDM), 4 pages (2018).
Puurunen "Surface Chemistry of Atomic Layer Depostion: A Case Study for the Trimethylaluminum/Water Process" Journal of Applied Physics, 97, 55 pages (2005).
Rahemi et al. "Variation in electron work function with temperature and its effect on the Young's modulus of metals" Scripta Materialia, 99, pp. 41-44 (2015).
SciFinder Search Results on hydrazido-based precursor for boron nitride films, search conducted Nov. 5, 2020, 5 pages (2020).
Shiba et al. "Stable yttrium oxyfluoride used in plasma process chamber" J. Vac. Sci. Technol. A, 35(2), 6 pages (2017).
Shigemoto et al. "Thermal cleaning of silicon nitride with fluorine and additive mixture" 1 page (2007).
Takaoka et al. "F-Propene-Dialkylamine Reaction Products as Fluorinating Agents" Bulletin of the Chemical Socity of Japan, vol. 52 (11), pp. 3377-3380 (1979).
Tsoutsou et al. "Atomic layer deposition of LaxZr1—xO2-d (x=0.25) high-k dielectrics for advanced gate stacks" Applied Physics Letters, 94, 3 pages (2009).
US PPA U.S. Appl. No. 60/545,181, filed Feb. 13, 2004 in the names of Matthew G. Goodman et al., and entitled "Forced Flow Susceptor with Exit Holes and Veins for Improvided Process" pp. 1-15 (2004).
US PPA U.S. Appl. No. 60/591,258, filed Jul. 26, 2004 in the names of Jeroen Stoutyesdijk et al., and entitled "Susceptor Support for Eliminating Backside Nodules" pp. 1-71 (2004).
US PPA U.S. Appl. No. 62/504,470, filed May 10, 2017 in the names of Jennifer Y. Sun et al., and entitled "Metal-Oxy-Fluoride Films for Chamber Components" pp. 1-82 (2017).
Van Asselt et al. "New Palladium Complexes of Cis-Fixed Bidentate Nitrogen Ligands as Catalysts for Carbon-Carbon Bond Formation" Organometallics, 11, pp. 1999-2001 (1992).
Van Asselt et al. "On the Mechanism of Formation of Homocoupled Products in the Carbon-Carbon Cross-Coupling Reaction Catalyzed by Palladium Complexes Containing Rigid Bidentate Nitrogen Ligands" Organometallics, 13, pp. 1972-1980 (1994).
Vayrynen et al. "Atomic Layer Deposition of Nickel Nitride Thin Films Using NiCL2 (TMPDA) and Tert-Butylhydrazine as Precursors" Phy. Status Solidi A, 216, 9 pages (2019).

(56) References Cited

OTHER PUBLICATIONS

Vesters et al. "Sensitizers in EUV Chemically Amplified Resist: Mechanism of sensitivity improvement" Proc. SPIE 10583 Extreme Ultraviolet (EUV) Lithography IX, 1058307, 11 pages (2018).
Wilklow-Marnell et al. "First-row transitional-metal oxalate resists for EUV" J. Micro/Nanolith. MEMS MOEMS 17(4) Oct.-Dec. 2018, 9 pages (2018).
Zhang et al. "Mechanical Stability of Air-gap Interconnects" Proc. Future Fab International, pp. 81-87 (2008).
Zientara et al. Journal of the European Ceramic Society, 27, Abstract, 1 page (2007).
Hayashi et al. "Spectroscopic properties of nitrogen doped hydrogenated amorphous carbon films grown by radio frequency plasma-enhanced chemical vapor deposition," Journal of Applied Physics. vol. 89, No. 12, pp. 7924-7931 (2001).
Jung et al., "Double Patterning of Contact Array with Carbon Polymer," Proc. of SPIE, 6924, 69240C, 1-10 (2008).
Miller et al. "Carbon nitrides: synthesis and characterization of a new class of functional materials," Phys. Chem. Chem. Phys., 19, pp. 15613-15638 (2017).

\* cited by examiner

METHOD OF FORMING A NITROGEN-CONTAINING CARBON FILM AND SYSTEM FOR PERFORMING THE METHOD

CROSS-REFERENCE TO RELATED APPLICATIONS

This application claims the benefit of and priority to U.S. Provisional Application No. 63/009,318, filed on Apr. 13, 2020 in the United States Patent and Trademark Office, the disclosure of which is incorporated herein in its entirety by reference.

FIELD OF INVENTION

The present disclosure generally relates to methods suitable for use in the manufacture of electronic devices. More particularly, examples of the disclosure relate to methods of forming nitrogen-containing carbon films, to methods of forming structures including such films, and to systems for performing the methods and/or forming the structures.

BACKGROUND OF THE DISCLOSURE

Nitrogen-containing carbon films can be used in a variety of applications during the manufacture of electronic devices. For example, nitrogen-containing carbon films can be used as optical films, as etching hard mask films, as a gap-fill film for trench patterns, and the like. For some applications, etching resistance, chemical mechanical planarization (CMP) resistance and/or thermal stability may desirably be relatively high. The incorporation of nitrogen in the nitrogen-containing carbon films can produce carbon-containing films that exhibit superior properties, such as increased etch resistance, increased CMP resistance, and/or thermal stability, compared to films that do not include the nitrogen containing material.

For some applications, the nitrogen-containing carbon films may desirably be formed using a plasma process. Use of a plasma process can allow for lower temperatures during the film deposition and/or increased deposition rates of the nitrogen-containing carbon films, compared to thermal processes.

Traditional plasma-assisted processes to form nitrogen-containing carbon films include a plasma strike on the carbon film after film formation and addition of $N_2$ and $NH_3$ in the gas phase during the film formation process. Such techniques generally result in C—$NH_2$ bond termination and dangling bonds, as verified with FTIR analysis. Although such techniques can work well for some applications, in other applications, it may be desirable to have or to increase an amount of carbon-terminated carbon-nitrogen bonds, such as C—N—C and C—N═C, in nitrogen-containing carbon films. The inclusion of carbon-terminated carbon-nitrogen bonds can improve desired chemical properties (e.g., etch and CMP resistance) and physical properties (e.g., optical) of nitrogen-containing carbon films.

Accordingly, improved methods for forming nitrogen-containing carbon films, particularly for methods of forming nitrogen-containing carbon films that include carbon-terminated carbon-nitrogen bonds, such as C—N—C and C—N═C, are desired.

Any discussion, including discussion of problems and solutions, set forth in this section, has been included in this disclosure solely for the purpose of providing a context for the present disclosure, and should not be taken as an admission that any or all of the discussion was known at the time the invention was made or otherwise constitutes prior art.

SUMMARY OF THE DISCLOSURE

Various embodiments of the present disclosure relate to methods of forming nitrogen-containing carbon films suitable for use in the formation of electronic devices. While the ways in which various embodiments of the present disclosure address drawbacks of prior methods and structures are discussed in more detail below, in general, exemplary embodiments of the disclosure provide improved methods that include improved precursors and techniques for forming nitrogen-containing carbon films.

In accordance with various embodiments of the disclosure, a method of forming a nitrogen-containing carbon film is provided. Exemplary methods can include providing a precursor to a reaction chamber and forming the nitrogen-containing film on a surface of a substrate using the precursor. Suitable precursors include compounds including carbon-terminated carbon-nitrogen bonds, such as one or more compounds (1) represented by (C—N—C)$_a$ and/or (C—N═C)$_{a1}$, wherein a and a1 are integers that are independently selected and that are greater than or equal to 1 and (2) cyclic compounds having a cyclic structure comprising C, H, O, and N. Exemplary cyclic compounds can include a cyclic skeleton, including, for example, between 5 and 7 atoms. The cyclic skeleton can include nitrogen. In some cases, the cyclic skeleton can consist of one or more of C, O, and N, such as C and N or O, C, and N. A cyclic compound can consist of C, H, O, and N. The cyclic compound can include a cyclic skeleton and one or more atoms (e.g., hydrogen and/or oxygen), groups, and/or side chains attached to the cyclic skeleton. At least one of the one or more sidechains can include $C_wH_xN_yO_z$, wherein w, x, y and z are each individually selected and are each a natural number (including zero). Exemplary methods can further include a step of providing a reactant to the reaction chamber. Exemplary reactants include one or more of hydrogen, nitrogen, a compound comprising hydrogen and nitrogen, and a hydrocarbon.

In accordance with yet further exemplary embodiments of the disclosure, a structure is formed, at least in part, by forming a nitrogen-containing carbon film as described herein.

In accordance with yet further exemplary embodiments of the disclosure, a system is provided for performing a method and/or for forming a structure as described herein.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

Figure 1:
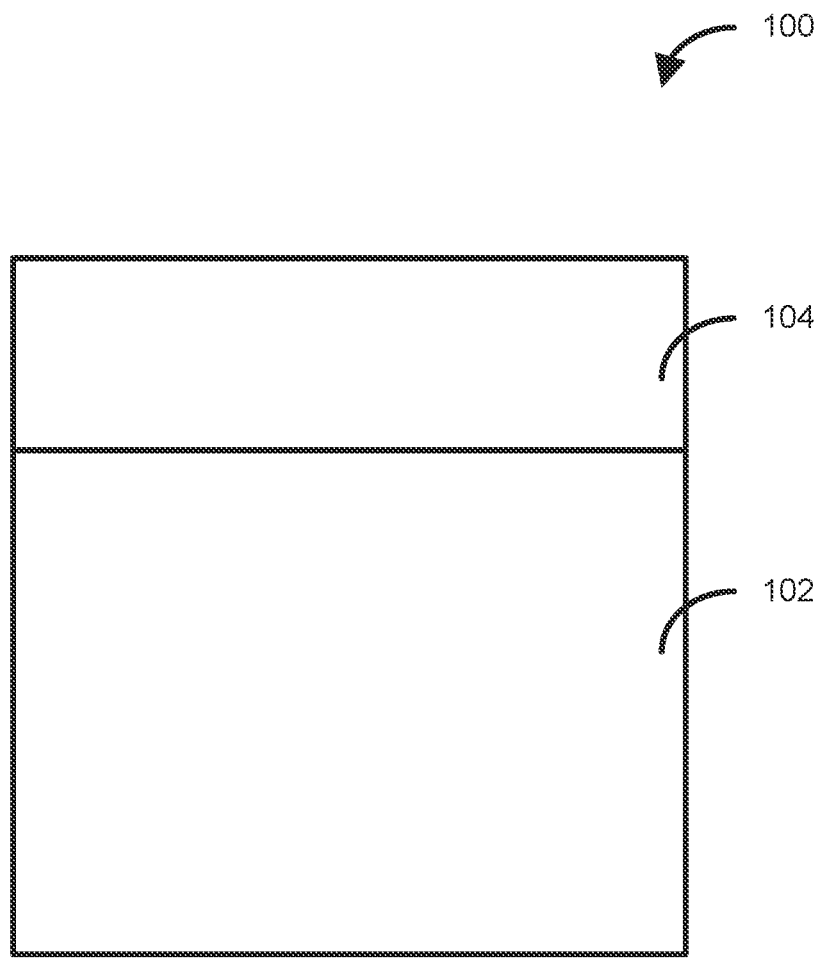
FIG. 1 illustrates a structure including a nitrogen-containing carbon film in accordance with exemplary embodiments of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to methods of forming a nitrogen-containing carbon film, to methods of forming structures including such films, to film structures formed using the methods, and to systems for performing the methods and/or forming the film structures.

Exemplary methods described herein can be used to form nitrogen-containing carbon films with carbon-terminated carbon-nitrogen bonds or form nitrogen-containing carbon films with an increased number of carbon-terminated carbon-nitrogen bonds, particularly C—N—C or C—NC. Such films can exhibit desired properties, such as optical properties, increased (e.g., dry) etch resistance, and/or increased CMP resistance. As set forth in more detail below, films including C—N—C or C—N=C can be obtained by using one or more precursors that include C—N—C or C—N=C bonds.

In this disclosure, "gas" can refer to material that is a gas at normal temperature and pressure, a vaporized solid and/or a vaporized liquid, and may be constituted by a single gas or a mixture of gases, depending on the context. A gas other than a process gas, i.e., a gas introduced without passing through a gas distribution assembly, such as a showerhead, other gas distribution device, or the like, may be used for, e.g., sealing a reaction space, which includes a seal gas, such as a rare gas. In some cases, such as in the context of deposition of material, the term "precursor" can refer to a compound that participates in the chemical reaction that produces another compound, and particularly to a compound that constitutes a film matrix or a main skeleton of a film, whereas the term "reactant" can refer to a compound, in some cases other than a precursor, that activates a precursor, modifies a precursor, or catalyzes a reaction of a precursor; a reactant may provide an element (such as O, H, N, C) to a film matrix and become a part of the film matrix when, for example, power (e.g., radio frequency (RF) or microwave power) is applied. In some cases, the terms precursor and reactant can be used interchangeably. The term "inert gas" refers to a gas that does not take part in a chemical reaction to an appreciable extent and/or a gas that excites a precursor (e.g., to facilitate polymerization of the precursor) when, for example, power (e.g., RF power) is applied, but unlike a reactant, it may not become a part of a film matrix to an appreciable extent.

As used herein, the term "substrate" can refer to any underlying material or materials that may be used to form, or upon which, a device, a circuit, or a film may be formed. A substrate can include a bulk material, such as silicon (e.g., single-crystal silicon), other Group IV materials, such as germanium, or compound semiconductor materials, such as Group III-V or Group II-VI semiconductors, and can include one or more layers overlying or underlying the bulk material. Further, the substrate can include various features, such as gaps (e.g., recesses or vias), lines or protrusions, such as lines having gaps formed therebetween, and the like formed on or within or on at least a portion of a layer or bulk material of the substrate. By way of examples, one or more features can have a width of about 10 nm to about 100 nm, a depth or height of about 30 nm to about 1,000 nm, and/or an aspect ratio of about 3.0 to 100.0.

In some embodiments, "film" refers to a layer extending in a direction perpendicular to a thickness direction. In some embodiments, "layer" refers to a material having a certain thickness formed on a surface and can be a synonym of a film or a non-film structure. A film or layer may be constituted by a discrete single film or layer having certain characteristics or multiple films or layers, and a boundary between adjacent films or layers may or may not be clear and may or may not be established based on physical, chemical, and/or any other characteristics, formation processes or sequence, and/or functions or purposes of the adjacent films or layers. The layer or film can be continuous—or not. Further, a single film or layer can be formed using multiple deposition cycles.

As used herein, the term "nitrogen-containing carbon layer" or "nitrogen-containing carbon material" can refer to a layer whose chemical formula can be represented as including carbon and nitrogen. Layers comprising nitrogen-containing carbon material can include other elements, such as one or more of oxygen and hydrogen. Nitrogen-containing carbon layers desirably include one or more of C—N—C and C—N=C.

As used herein, the term "structure" can refer to a partially or completely fabricated device structure. By way of examples, a structure can be a substrate or include a substrate with one or more layers and/or features formed thereon.

As used herein, the term "cyclic deposition process" can refer to a vapor deposition process in which deposition cycles, typically a plurality of consecutive deposition cycles, are conducted in a process chamber. Cyclic deposition processes can include cyclic chemical vapor deposition (CVD) and atomic layer deposition processes. A cyclic deposition process can include one or more cycles that include plasma activation of a precursor, a reactant, and/or an inert gas.

In this disclosure, "continuously" can refer to without breaking a vacuum, without interruption as a timeline, without any material intervening step, immediately thereafter, as a next step, or without an intervening discrete physical or chemical structure between two structures other than the two structures in some embodiments and depending on the context.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments. Further, in this disclosure, the terms "including," "constituted by" and "having" can refer independently to "typically or broadly comprising," "comprising," "consisting essentially of," or "consisting of" in some embodiments. In this disclosure, any defined meanings do not necessarily exclude ordinary and customary meanings in some embodiments.

FIG. 1 illustrates a structure 100 including a substrate 102 and a nitrogen-containing film 104 deposited overlying the substrate. In accordance with examples of the disclosure, nitrogen-containing film 104 can be formed using a method as described herein. Additionally or alternatively, nitrogen-containing film 104 can include carbon-terminated carbon-nitrogen bonds. For example, all nitrogen-carbon bonds can be terminated with a carbon-nitrogen bond.

Methods in accordance with exemplary embodiments of the disclosure include providing a precursor to a reaction chamber and forming the nitrogen-containing film on a surface of a substrate using the precursor. The methods can also include steps of providing a substrate to a reaction chamber and, in accordance with some examples, providing a reactant to the reaction chamber. The step of forming can be thermally activated or plasma activated.

During the step of providing a precursor to a reaction chamber, one or more precursors are flowed into a reaction chamber of a gas-phase reactor. In accordance with examples of the disclosure, the reaction chamber can form part of a cyclical deposition reactor, such as an atomic layer deposition (ALD) (e.g., PEALD) reactor or chemical vapor deposition (CVD) (e.g., PECVD) reactor. Various steps of methods described herein can be performed within a single reaction chamber or can be performed in multiple reaction chambers, such as reaction chambers of a cluster tool.

During the step of providing a substrate within a reaction chamber, before the step of providing the precursor to the reaction chamber, or during the step of providing the precursor to the reaction chamber, the substrate can be brought to a desired temperature and/or the reaction chamber can be brought to a desired pressure, such as a temperature and/or pressure suitable for subsequent steps. By way of examples, a temperature (e.g., of a substrate or a substrate support) within a reaction chamber can be less than or equal to 400° C. or between about 550° C. and about 650° C. In accordance with particular examples of the disclosure, the substrate includes one or more features, such as recesses.

In accordance with examples of the disclosure, the precursor includes one or more compounds in which one or more nitrogen atoms are bonded to a carbon atom, wherein the carbon atom is a terminal atom.

Figure 2:
FIGS. 2 and 3 illustrate molecules including carbon-terminated carbon-nitrogen bonds.

FIG. 2 illustrates molecules/compounds (N-methyl methanimine and trimethylamine) that include a carbon-terminated carbon-nitrogen bond. Although such compounds may work well for some applications, gases composed of such molecules can exhibit an unfavorable odor and therefore may desirably be avoided in some applications.

Figure 3:
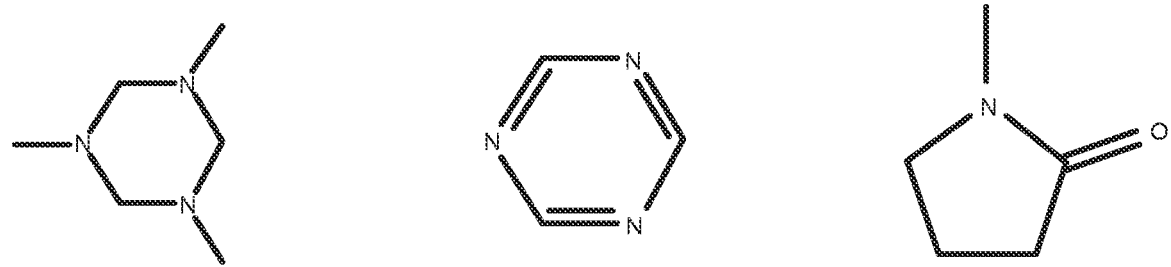

FIG. 3 illustrates exemplary cyclic structures that include cyclic skeletons (e.g., the ring portion of the compound/structure) in accordance with examples of the disclosure. Use of cyclic compounds that include one or more carbon-terminated carbon-nitrogen bonds (e.g., within the skeleton of the molecule) may be desirable over linear or non-cyclic compounds that include carbon-terminated carbon-nitrogen bonds, because the cyclic compounds with the skeleton including the one or more carbon-terminated carbon-nitrogen bonds may not exhibit as offensive of an odor as the linear compounds with the one or more carbon-terminated carbon-nitrogen bonds. In accordance with further examples of the disclosure, the precursor does not include a halogen, such as fluorine (F), chlorine (CI), bromine (Br), iodine (I), or astatine (At).

In accordance with examples of the disclosure, a chemical formula of the precursor comprises one or more of (1) (C—N—C)$_a$ and/or (C—N═C)$_{a1}$, wherein a and a1 are integers that are independently selected and that are greater than or equal to 1 and (2) a cyclic compound, such as a cyclic compound having a cyclic structure comprising C, H, O, and N. A can range from, for example, about 3 to about 6. A1 can range from about 3 to about 6.

In accordance with examples of the disclosure, a cyclic skeleton of a cyclic compound can include between 5 and 7 atoms. The cyclic skeleton can include one or more nitrogen atoms. A nitrogen atom in the cyclic skeleton can form a single bond or a double bond with carbon in the cyclic skeleton. In addition to carbon and/or nitrogen, a cyclic skeleton can include one or more oxygen atoms. In some cases, the cyclic skeleton can consist of one or more of C, O, and N—for example, C and N or C, N and O. In accordance with further examples, the cyclic compound, including the cyclic skeleton, can consist of one or more of C, H, O, and N—e.g., C, H, and N or C, H, N, and O.

A cyclic compound can include one or more atoms, molecules, groups, and/or sidechains attached to the cyclic skeleton. The atoms can include, for example, N, C, O, and H. The molecules or groups can include, for example, methyl groups, ethyl groups, other hydrocarbon groups, hydroxy groups, or the like.

The side chains can include molecules or groups that are represented by the chemical formula $C_wH_xN_yO_z$, wherein w, x, y and z are each individually selected and are each a natural number, and wherein a natural number can be zero. X can range from 0 to 9 or 15, Y can range from 0 to 3 or 6, and Z can range from 0 to 3.

By way of particular examples, the precursor can be selected from one or more of the group consisting of 1,3,5-trimethylhexahydro-1,3,5-triazine; 1,3,5-triazine; 2,4,6-trimethyl-s-triazene; and 1-methyl-2-pyrrolidinone.

The precursor can be a gas, a liquid, or a solid at normal temperature and pressure. In the cases of liquid or solid precursors, the precursor can be heated to a temperature sufficient to form a gas phase of the precursor.

As noted above, methods in accordance with the disclosure can include providing a reactant to the reaction chamber. The reactant can be flowed to the reaction chamber during or overlapping in time with the step of providing a precursor to a reaction chamber. In some cases, the reactant can be pulsed to the reaction chamber. In some cases, the method of forming a nitrogen-containing carbon film includes a cyclic deposition process, where the step of providing a precursor to a reaction and providing a reactant to the reaction chamber can be separated by a purge step. The purge step can include providing a vacuum and/or a purge gas to the reaction chamber.

In accordance with embodiments of the disclosure, a reactant comprises a compound comprising one or more of H, N, and C. In some cases, the compound can consist of one or more of H, N, and C. By way of examples, the reactant can include one or more of hydrogen, nitrogen, a compound comprising hydrogen and nitrogen (e.g., ammonia, hydrazine, or the like), and a hydrocarbon (e.g., comprising only C and H).

In accordance with further examples of the disclosure, although a precursor can include nitrogen, an amount of nitrogen in the nitrogen-containing carbon film can be manipulated by changing a (e.g., volumetric) ratio of a flowrate of the precursor to a flowrate of the reactant.

One or more of the reactant and the precursor can be exposed to a plasma to create an activated species. The plasma can be generated using a direct plasma, as discussed in more detail below, and/or using a remote plasma. In some cases, the reactant can be exposed to a plasma to generate reactant activated species. In some cases, both the precursor and the reactant are exposed to the plasma (e.g., at the same time or during an overlap period). The activated species can be formed using a continuous plasma or a pulsed plasma. In some cases, an inert gas can be continuously flowed to the reaction chamber and activated species can be periodically formed by cycling the power used to form the plasma.

The plasma can be formed using, for example, a capacitively couple plasma (CCP), and inductively coupled plasma (ICP), or a surface plasma, such as a microwave plasma.

A power (e.g., applied to electrodes) to form or maintain the plasma can range from about 50 W to about 600 W. A frequency of the power can range from about 10 kHz to about 100 MHz.

Figure 4:
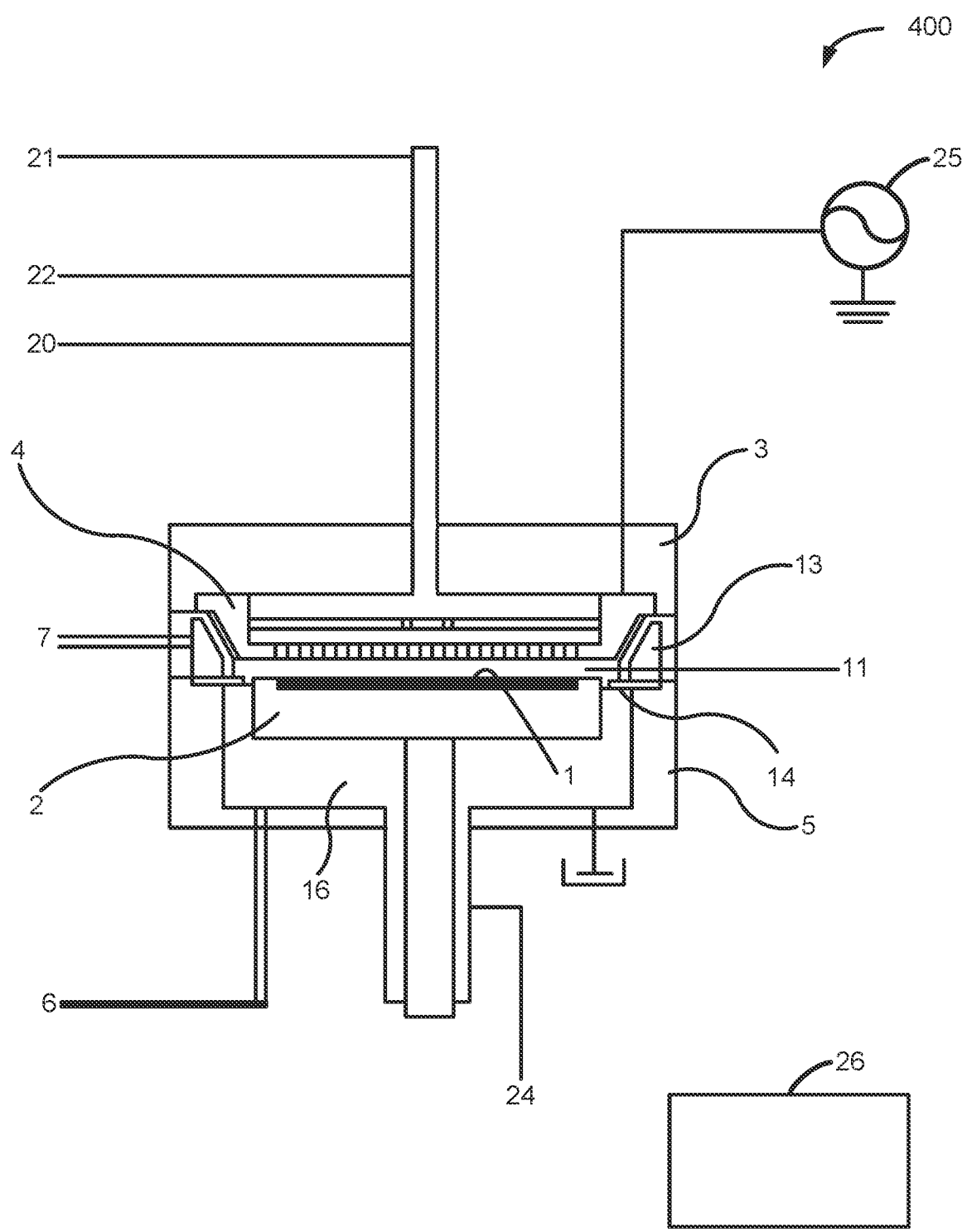
FIG. 4 illustrates a system in accordance with exemplary embodiments of the disclosure.

FIG. 4 illustrates a reactor system 400 in accordance with exemplary embodiments of the disclosure. Reactor system 400 can be used to perform one or more steps or sub steps as described herein and/or to form one or more structures or portions thereof as described herein. For example, reactor system 400 can be used to generate a direct plasma for use in methods disclosed herein.

Reactor system 400 includes a pair of electrically conductive flat-plate electrodes 4, 2 in parallel and facing each other in the interior 11 (reaction zone) of a reaction chamber 3. A plasma can be excited within reaction chamber 3 by applying, for example, HRF power (e.g., 13.56 MHz, 27 MHz, microwave frequencies, or the like) from power source 25 to one electrode (e.g., electrode 4) and electrically grounding the other electrode (e.g., electrode 2). A temperature regulator can be provided in a lower stage 2 (the lower electrode), and a temperature of a substrate 1 placed thereon can be kept at a desired temperature. Electrode 4 can serve as a gas distribution device, such as a shower plate. Reactant gas, dilution gas, if any, precursor gas, and/or the like can be introduced into reaction chamber 3 using one or more of a gas line 20, a gas line 21, and a gas line 22, respectively, and through the shower plate 4. Although illustrated with three gas lines, reactor system 400 can include any suitable number of gas lines.

In reaction chamber 3, a circular duct 13 with an exhaust line 7 is provided, through which gas in the interior 11 of the reaction chamber 3 can be exhausted. Additionally, a transfer chamber 5, disposed below the reaction chamber 3, is provided with a seal gas line 24 to introduce seal gas into the interior 11 of the reaction chamber 3 via the interior 16 (transfer zone) of the transfer chamber 5, wherein a separation plate 14 for separating the reaction zone and the transfer zone is provided (a gate valve through which a wafer is transferred into or from the transfer chamber 5 is omitted from this figure). The transfer chamber is also provided with an exhaust line 6. In some embodiments, the deposition and treatment steps are performed in the same reaction space, so that two or more (e.g., all) of the steps can be continuously conducted without exposing the substrate to air or other oxygen-containing atmosphere.

In some embodiments, continuous flow of an inert or carrier gas to reaction chamber 3 can be accomplished using a flow-pass system (FPS), wherein a carrier gas line is provided with a detour line having a precursor reservoir (bottle), and the main line and the detour line are switched, wherein when only a carrier gas is intended to be fed to a reaction chamber, the detour line is closed, whereas when both the carrier gas and a precursor gas are intended to be fed to the reaction chamber, the main line is closed and the carrier gas flows through the detour line and flows out from the bottle together with the precursor gas. In this way, the carrier gas can continuously flow into the reaction chamber and can carry the precursor gas in pulses by switching between the main line and the detour line, without substantially fluctuating pressure of the reaction chamber.

A skilled artisan will appreciate that the apparatus includes one or more controller(s) 26 programmed or otherwise configured to cause one or more method steps as described herein to be conducted. The controller(s) are communicated with the various power sources, heating systems, pumps, robotics and gas flow controllers, or valves of the reactor, as will be appreciated by the skilled artisan.

In some embodiments, a dual chamber reactor (two sections or compartments for processing wafers disposed close to each other) can be used, wherein a reactant gas and a noble gas can be supplied through a shared line, whereas a precursor gas is supplied through unshared lines.

The example embodiments of the disclosure described above do not limit the scope of the invention, since these embodiments are merely examples of the embodiments of the invention. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A method of forming a nitrogen-containing carbon film, the method comprising the steps of:
   providing a precursor to a reaction chamber, wherein a chemical formula of the precursor comprises
   a cyclic compound having a cyclic structure comprising C, H, and N; and
   forming the nitrogen-containing film on a surface of a substrate using the precursor,
   wherein the precursor comprises a carbon-terminated carbon-nitrogen bond and wherein the precursor is selected from one or more of the group consisting of 1,3,5-trimethylhexahydro-1,3,5-triazine, 2,4,6-trimethyl-s-triazene, and 1-methyl-2-pyrrolidinone.

2. The method of claim 1, further comprising a step of providing a reactant to the reaction chamber.

3. The method of claim 2, wherein the reactant comprises a compound comprising C.

4. The method of claim 2, wherein the reactant comprise a hydrocarbon.

5. The method of claim 2, further comprising a step of manipulating an amount of nitrogen in the nitrogen-containing carbon film by changing a ratio of a flowrate of the precursor to a flowrate of the reactant.

6. The method of claim 2, wherein the reactant comprises a compound comprising one or more of H, N, and C.

7. The method of claim 2, wherein the reactant comprises one or more of hydrogen, nitrogen, a compound comprising hydrogen and nitrogen, and a hydrocarbon.

8. The method of claim 1, wherein a temperature of the substrate is between about 550° C. and about 650° C.

9. The method of claim 1, wherein the step of forming the nitrogen-containing carbon film comprises a plasma process.

10. The method of claim 9, wherein the plasma process comprises a direct plasma.

11. The method of claim 9, wherein the plasma process comprises use of one or more of a capacitively-coupled plasma, an inductively-coupled plasma, and a microwave plasma.

12. The method of claim 1, wherein the nitrogen-containing carbon film is deposited using a plasma-enhanced atomic layer deposition process.

13. A method of forming a structure comprising a method of claim 1, wherein the nitrogen-containing carbon film comprises carbon-terminated carbon-nitrogen bonds.

* * * * *